(12) United States Patent
Takeyabu et al.

(10) Patent No.: US 6,392,494 B2
(45) Date of Patent: *May 21, 2002

(54) FREQUENCY COMPARATOR AND CLOCK REGENERATING DEVICE USING THE SAME

(75) Inventors: Masato Takeyabu, Sapporo; Akira Kikuchi, Miyagi; Toshiyuki Sakai, Kawasaki, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/115,952

(22) Filed: Jul. 15, 1998

(30) Foreign Application Priority Data

Nov. 26, 1997 (JP) .............................................. 9-324485

(51) Int. Cl.[7] .............................................. H03L 7/087

(52) U.S. Cl. .......................... 331/11; 331/1 A; 331/1 R; 331/25; 327/159; 327/160

(58) Field of Search ............................ 331/11, 1 A, 1 R, 331/25; 327/160, 159, 156

(56) References Cited

U.S. PATENT DOCUMENTS

| | | | |
|---|---|---|---|
| 5,015,970 A | | 5/1991 | Williams et al. ............... 331/11 |
| 5,525,935 A | * | 6/1996 | Joo et al. ....................... 331/11 |
| 5,574,406 A | * | 11/1996 | Sauer et al. ................... 331/11 |

* cited by examiner

Primary Examiner—Arnold Kinkead
(74) Attorney, Agent, or Firm—Katten Muchin Zavis Rosenman

(57) ABSTRACT

A frequency comparator includes a circuit comparing, independently of a phase relationship between first and second clocks, frequencies of the first and second clocks and outputting first and second detection signals when the first clock has frequencies higher and lower than those of the second clock, respectively. The first and second detection signals are output for respective times based on a difference between the frequencies of the first and second clocks.

18 Claims, 20 Drawing Sheets

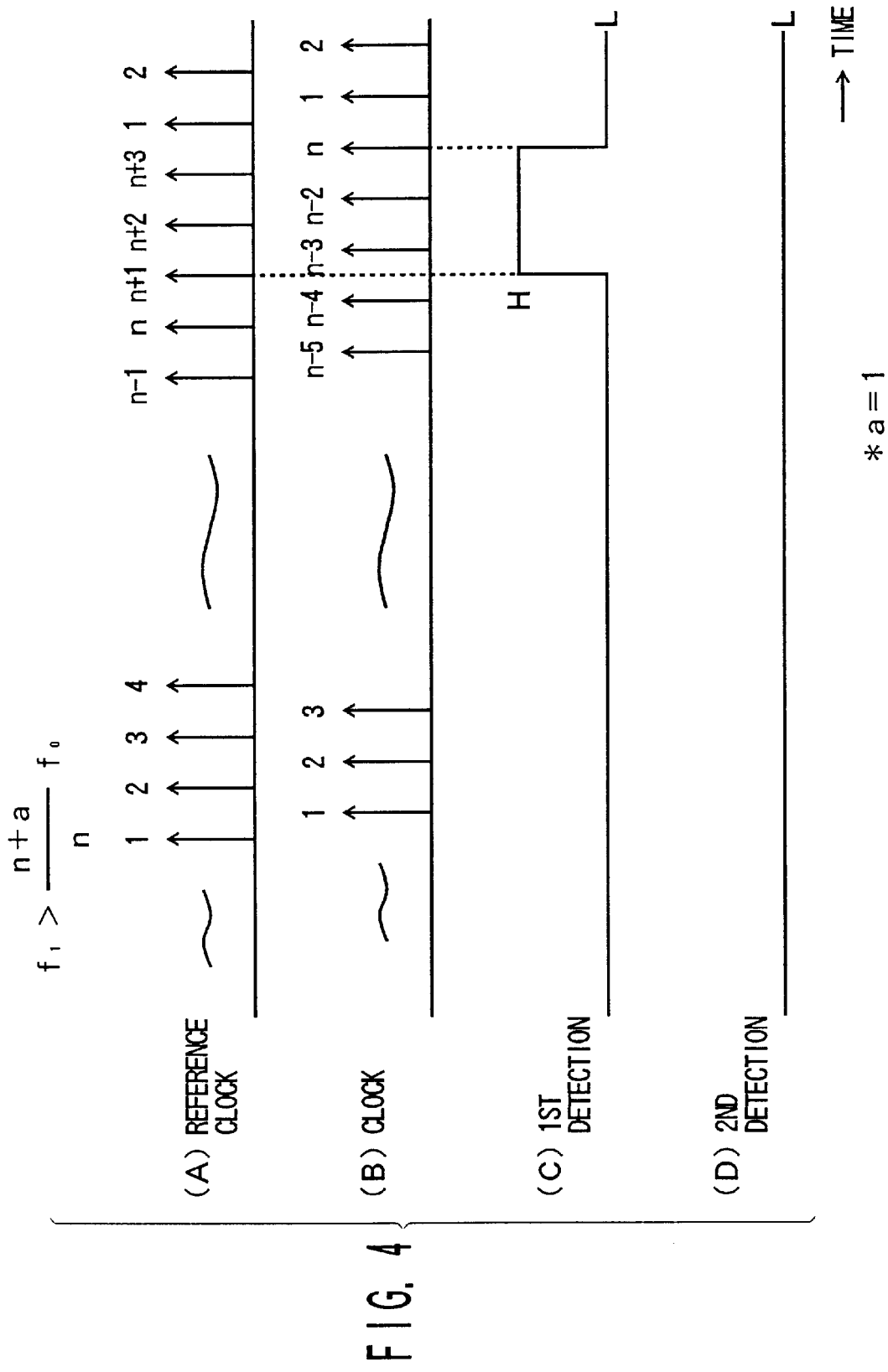
F I G. 4

(A)

FREQUENCY COMPARATOR AND CLOCK REGENERATING DEVICE USING THE SAME

BACKGROUND OF THE INVENTION

1. Field of the Invention

The present invention generally relates to frequency comparators and clock regenerating devices using the same, and more particularly to a frequency comparator which compares digital signals and a clock regenerating device using such a frequency comparator.

2. Description of the Related Art

A clock reproduction device is known which uses a PLL (Phase-Locked Loop) and regenerates a clock from input data. In such a clock regenerating device, an output clock of the PLL is compared with a reference clock, and a voltage-controlled oscillator (VCO) provided in the PLL is controlled based on an error which corresponds to the difference between the output clock and the reference clock.

A clock regenerating device as described above is disclosed in U.S. Pat. No. 5,015,970. The clock regenerating device frequency-divides the output signal of the VCO at frequency-dividing ratios of 1/(N+1) and 1/(N−1). The two signals thus obtained are phase-compared with a reference clock obtained by frequency-dividing the output clock of the VCO at a frequency-dividing ratio of 1/M, so that a coarse adjustment signal can be obtained. The output clock of the VCO is also phase-compared with input data, and thus a fine adjustment is obtained. The coarse adjustment signal and the fine adjustment signals are added by a smoothing filter, and a resultant control signal which controls the VCO is obtained.

However, the above clock regenerating device has the following disadvantages. First, the device obtains the coarse adjustment signal by the phase comparing operation, and does not perform a frequency comparing operation independent of phases. Second, the device generates the VCO control signal which changes the phase of the output clock of the VCO on the basis of the coarse adjustment signal, and thus does not operate stably so that the PLL attempts to obtain a plurality of different in-phase (phase synchronized) states. If it is attempted to avoid unstable operation, there is nothing other than a modification in which the coarse adjustment is carried out more slowly. However, it takes a longer time to complete the coarse adjustment.

SUMMARY OF THE INVENTION

It is a general object of the present invention to provide a frequency comparator and a clock regenerating device using the same in which the above disadvantages are eliminated.

A more specific object of the present invention is to provide a frequency comparator capable of comparing frequencies independent of phases and generating a coarse adjustment signal by frequency comparison so that a stable and high-speed frequency pull-in operation can be carried out and to provide a clock reproduction device using such a frequency comparator.

The above objects of the present invention are achieved by a frequency comparator comprising: a circuit comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks. Hence, it is possible to detect the frequency difference independently of the phase relationship between the first and second clocks and to thus obtain the first and second detection signals having pulse widths corresponding to the frequency difference.

The frequency comparator may be configured so that the circuit outputs the first detection signal when the frequency of the first clock is higher than that of the second clock at a first ratio or more, and outputs the second detection signal when the frequency of the first clock is lower than that of the second clock at a second ratio or more. Hence, it is possible to define an insensitive range in which none of the first and second detection signals are output when the first and second clocks have respective frequencies close to each other.

The frequency comparator may be configured so that the circuit comprises: a first counter which counts the first clock and outputs the first detection signal when a first count value of the first counter is equal to or greater than (n+a) where n and a are integers; a second counter which counts the second clock and outputs the second detection signal when a second count value of the second counter is equal to or greater than (n+b) where b is an integer; and a reset unit which resets the first and second counters when the first and second count values are both equal to or greater than the n. Hence, it is possible to detect the frequency difference independently of the phase relationship between the first and second clocks and to thus obtain the first and second detection signals having pulse widths corresponding to the frequency difference.

The frequency comparator may be configured so that one of the first and second detection signals is output until the reset unit resets the first and second counters.

The frequency comparator may be configured so that the circuit comprises: a first counter which counts the first clock and outputs the first detection signal when a first count value of the first counter is equal to or greater than (n+a) where n and a are integers; a second counter which counts the second clock and outputs the second detection signal when a second count value of the second counter is equal to or greater than (n+b) where b is an integer; a reset unit which generates a reset signal which resets the first and second counters when the first and second count values are both equal to or greater than the n; a first hold circuit which holds the first detection signal until the first hold circuit is reset in response to the reset signal; and a second hold circuit which holds the second detection signal until the second hold circuit is reset in response to the reset signal. Hence, it is sufficient that the first and second counters can count up to (n+a) and (n+b), respectively, so that the counters can be simplified.

The above objects of the present invention are also achieved by a clock regenerating device comprising: a frequency comparator comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks; a phase comparator generating a fine-adjustment signal based on a difference between a phase of input data and a phase of the second clock; a combining unit generating a control signal from the first and second detection signals serving as a coarse-adjustment signal and the fine-adjustment signal; and an oscillator outputting a regenerated lock which is an oscillation output having a frequency based on the control signal and corresponds to the second clock. The combining unit combining the first and second signals and the fine-adjustment signal so that the following condition is satisfied:

$$(\Delta pf/\Delta ff)<(\Delta pc/\Delta fc)$$

where $\Delta pc$ and $\Delta fc$ respectively denote a phase variation and a frequency variation in the regenerated clock caused by the coarse-adjustment signal per unit time, and $\Delta pf$ and $\Delta ff$ respectively denote a phase variation and a frequency variation in the regenerated clock caused by the fine-adjustment signal per unit time. Hence, it is possible to independently obtain frequency information from the second clock and phase information from the input data without any interference and to rapidly pull the circuit in phase.

The clock regenerating device may be configured so that the fine-adjustment signal includes fine-adjustment up and down signals based on the phase relationship between the input data and the second clock.

The clock regenerating device may be configured so that the coarse-adjustment signal is output during only a time based on the frequency difference between the first clock and the second clock.

The clock regenerating device may be configured so that the coarse-adjustment signal includes a voltage or current based on the frequency difference between the first clock and the second clock.

The clock regenerating device may be configured so that the frequency comparator comprises: a first counter which counts the first clock and outputs the first detection signal when a first count value of the first counter is equal to or greater than (n+a) where n and a are integers; a second counter which counts the second clock and outputs the second detection signal when a second count value of the second counter is equal to or greater than (n+b) where b is an integer; and a reset unit which resets the first and second counters when the first and second count values are both equal to or greater than the n.

The clock regenerating device may be configured so that the combining unit comprises an adder unit which adds an integrated value of the coarse-adjustment signal, an integrated value of the fine-adjustment signal, and an instantaneous value of the fine-adjustment signal. Hence, it is possible to integrate the coarse-adjustment and fine-adjustment signals by means of a common integrator and to completely eliminate the phase information from the second clock originally unnecessary in the in-phase pulling operation.

The clock regenerating device may be configured so that the combining unit comprises an adder unit which adds the coarse-adjustment signal and the fine-adjustment signal; an integral unit which integrates an output signal of the adder unit; an instantaneous voltage generating unit which generates an instantaneous voltage based on the fine-adjustment signal; and a mixing unit which adds an output of the integral unit and the instantaneous voltage and thus generates the control signal. Hence, it is possible to obtain the control signal based on both the frequency comparing operation and the phase comparing operation.

The clock regenerating device may be configured so that the adder unit comprises: a first current switch which charges a first capacitor provided in the integral unit with a constant current by a supply of the first detection signal; a second current switch which discharges the first capacitor with a constant current by a supply of the second detection signal; a third current switch which charges the first capacitor with a constant current by a supply of the first-adjustment signal; and a fourth current switch which discharges the first capacitor with a constant current by a supply of the fine-adjustment signal. Hence, it is possible to perform the integral operation by charging and discharging the first capacitor on the basis of the first and second detection signals and the fine-adjustment signal.

The clock regenerating device may be configured so that the adder unit comprises: a first OR circuit which performs an OR operation on the first detection signal and the fine-adjustment signal and thus outputs a first output; a second OR circuit which performs an OR operation on the second detection signal and the fine-adjustment signal and thus outputs a second output; a fifth switch which charges a first capacitor provided in the integral unit with a constant current by the first output; and a sixth switch which discharges the first capacitor with a constant current by the second output. Hence, it is possible to perform the integral operation by charging and discharging the first capacitor on the basis of the first and second detection signals and the fine-adjustment signal.

The clock regenerating device may be configured so that the mixing unit comprises: a buffer supplied with the output of the integral unit; and a first resistor supplied with an output of the buffer, the instantaneous voltage generating unit supplying a constant current to the first resistor in response to a supply of the fine-adjustment signal. Hence, the control signal can be obtained by adding the voltage generated by the constant current flowing in the first resistor in accordance with a supply of the fine-adjustment signal.

The clock regenerating device may be configured so that the instantaneous voltage generating unit comprises: a second resistor; a constant-voltage source which applies a constant voltage across the second resistor; and a unit which causes a current proportional to a current flowing in the second resistor to flow in the first resistor by a supply of the fine-adjustment signal. Hence, it is possible to stabilize the voltage drop developed across the first resistor by the current based on a supply of the fine-adjustment signal independent of variations in temperature, power supply and/or production process.

The clock regenerating device may be configured so that: the instantaneous voltage generating unit comprises an inverted amplifier having the first resistor as a feedback element; and the integral unit comprises another inverted amplifier having the first capacitor as a feedback element.

The clock regenerating device may be configured so that it further comprises a voltage dividing circuit which includes resistors connected in series and has an end fixed to a given potential, a divided voltage being supplied to the oscillator. Hence, it is possible to reduce the capacitance of the first capacitor and reduce the chip area occupied by the clock regenerating circuit.

The clock regenerating device may further comprise a phase-locked loop which is formed on a semiconductor chip on which the clock regenerating device is formed and which includes another integral unit which outputs said given potential. The two integral units are formed on the same chip and the first capacitor can further be reduced.

The clock regenerating device may be configured so that the oscillator comprises: a charge current switch supplying a charging current; a discharge current switch supplying a discharge current; a second capacitor which is charged and discharged by the charging and discharging currents, and a circuit part which generates a switching signal for turning ON one of the charge current switch and the discharge current switch by comparing a voltage developed across the second capacitor with first and second reference voltages and generating the regenerated clock from the switching signal, the charge current switch and the discharge current switch being coupled to the second capacitor through respective current output transistors. Hence, it is possible to suppress occurrence of noise caused by switching of the current charge and discharge switches.

BRIEF DESCRIPTION OF THE DRAWINGS

Other objects, features and advantages of the present invention will become more apparent from the following detailed description when read in conjunction with the accompanying drawings, in which:

FIG. 4 is a timing chart of yet another operation of the frequency comparator shown in FIG. 1;

DESCRIPTION OF THE PREFERRED EMBODIMENTS

Figure 1:
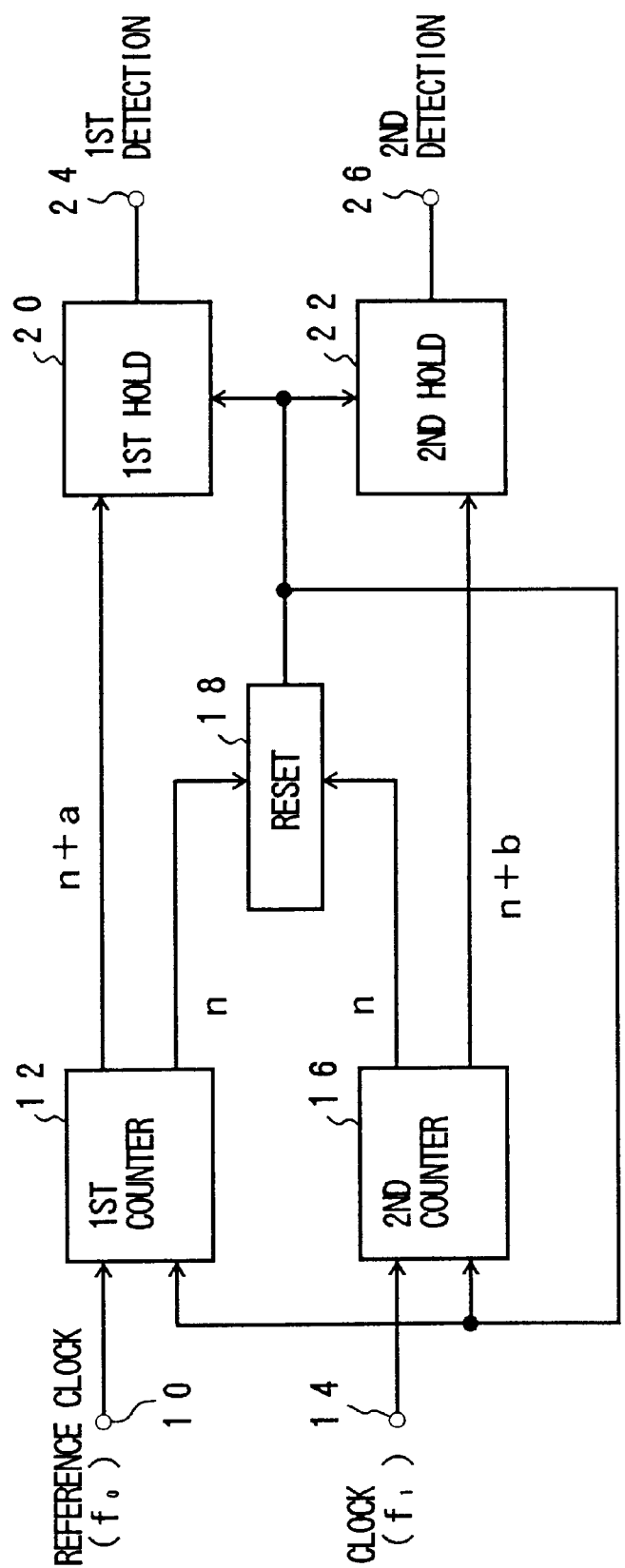
FIG. 1 is a block diagram of a frequency comparator according to an embodiment of the present invention.

FIG. 1 is a block diagram of a frequency comparator according to an embodiment of the present invention. A reference clock (frequency $f_0$) serving as a first clock is applied to a first counter 12 via a terminal 10. A compared clock (frequency $f_1$) serving as a second clock is applied to a second counter 16 via a terminal 14. The first counter 12 is reset to zero in response to a reset signal, and then starts counting the reference clock. When the count value becomes equal to n, the first counter 12 supplies an n detection signal to a reset circuit 18. When the count value becomes equal to n+a, the first counter 12 supplies an (n+a) detection signal to a first hold circuit 20. The second counter 16 is reset to zero in response to the reset signal, and then starts counting the supplied clock. When the count value of the second counter 16 becomes equal to n, the second counter 16 supplies an n detection signal to the reset circuit 18. When the count value becomes equal to n+b, the second counter 16 supplies an (n+b) detection signal to a second hold circuit 22.

The reset circuit 18 generates the reset signal when receiving the n detection signals from both the first counter 12 and the second counter 16, so that the first and second counters 12 and 16 are reset to zero and the first and second hold circuits 20 and 22 are reset. When the first hold circuit 20 is supplied with the (n+a) detection signal from the first counter 12, the first hold circuit 20 outputs, to a terminal 24, a first detection signal, which is, for example, at a high level, until it is reset. When the second hold circuit 22 is supplied with the (n+b) detection signal from the second counter 16, the second hold circuit 22 outputs, to a terminal 26, a second detection circuit, which is, for example, at a high level, until it is reset.

Figure 2:
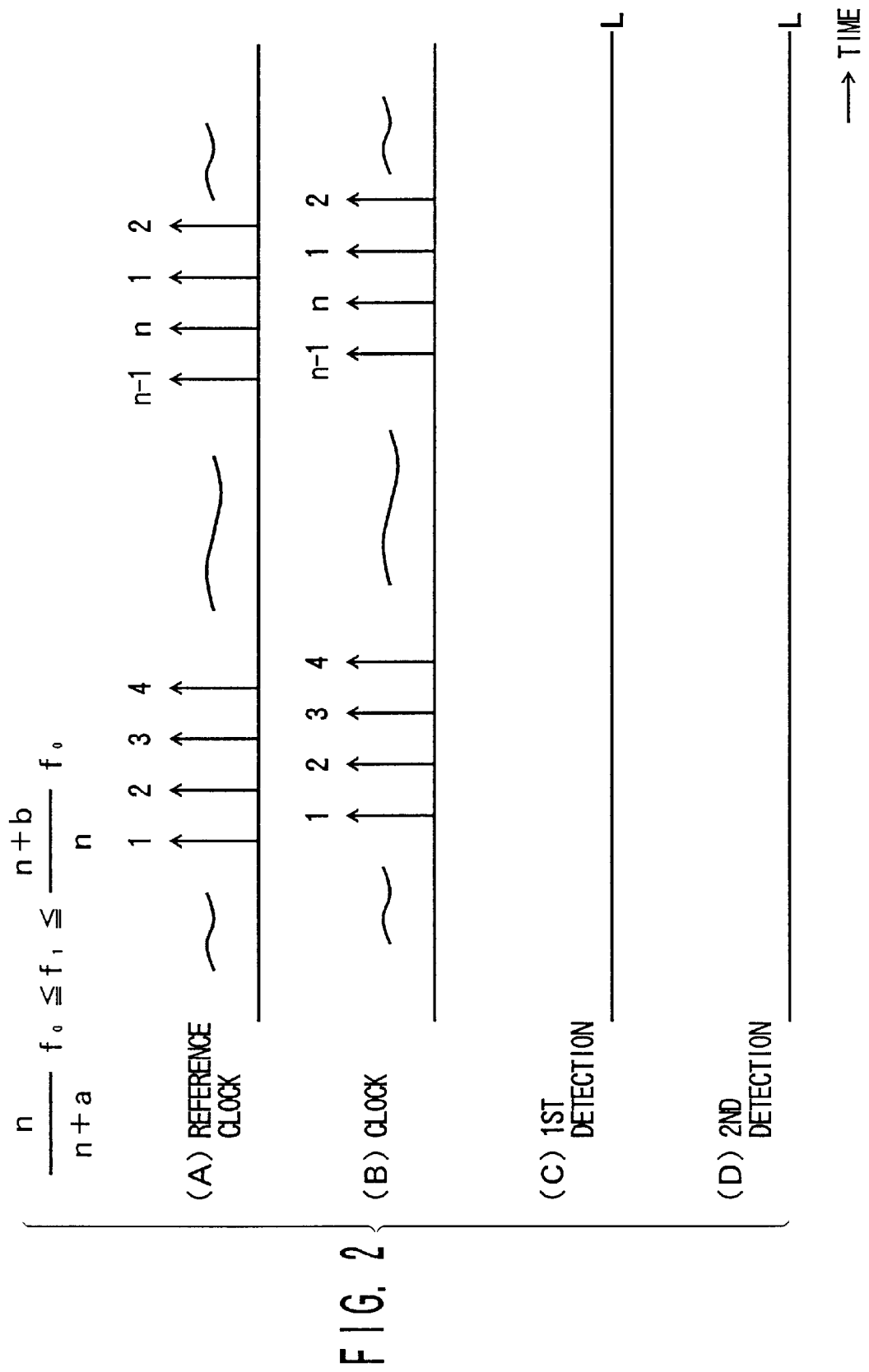
FIG. 2 is a timing chart of an operation of the frequency comparator shown in FIG. 1.

In a case where a condition, $n \cdot f_0/(n+a) \leq f_1 < (n+b)$ is satisfied, one of the first and second counters 12 and 16 supplied with the reference clock and the compared clock respectively shown in FIGS. 2(A) and 2(B) detects the count value n ahead of the other. Then, the other counter detects the count value n before (n+a) or (n+b) is detected. The reset circuit 18 performs the reset operation when both the counters 12 and 16 detect the count value n, and thus the first and second detection signals are not output, as shown in FIGS. 2(C) and 2(D), respectively.

Figure 3:
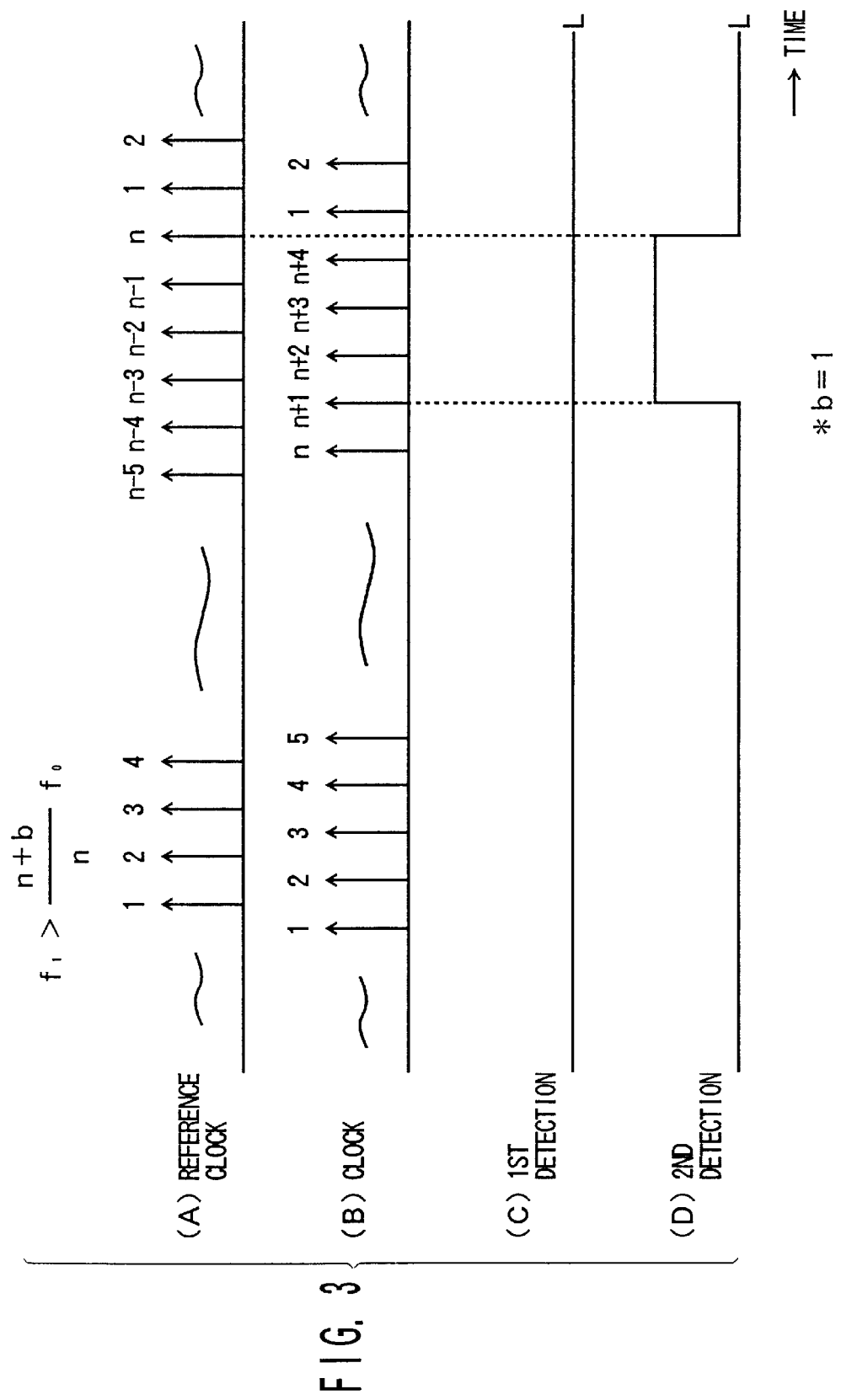
FIG. 3 is a timing chart of another operation of the frequency comparator shown in FIG. 1.

In a case where a condition, $f_1 > (n+b) \cdot f_0/n$ is satisfied, the second counter 16 detects the count value n by the compared clock shown in FIG. 3(B), and then detects the count value (n+b). In this case, b is equal to 1. Hence, a shown in FIG. 3(D), the second detection signal which is at the high level is generated. Thereafter, the first counter 12 detects the count value n by the reference clock shown in FIG. 3(A). Thus, the reset circuit 18 performs the reset operation, and the second detection signal is switched to the low level, as shown in FIG. 3(D). In this case, the first detection signal is not output, as shown in FIG. 3(C).

In short, when the frequency $f_1$ of the clock is higher than that of the reference clock $f_0$ by a given value or more, the second detection signal is output. The output period (pulse width) of the second detection signal can be written as $n/f_0 - (n+b)/f_1$.

In a case where a condition, $f_1 < n \cdot f_0/(n+a)$ is satisfied, the first counter 12 detects the count value n by the reference clock, and then detects the count value (n+a). In this case, a is equal to 1. Hence, as shown in FIG. 4(C), the first detection signal that is at the high level is generated. Then, when the second counter 16 detects the count value n by the compared clock shown in FIG. 4(B), the reset circuit 18 performs the reset operation, and the first detection signal is switched to the low level, as shown in FIG. 4(C). In this case, the second detection signal is not output, as shown in FIG. 4(D).

In short, when the frequency $f_1$ of the clock is lower than that of the reference clock $f_0$ by a given value or more, the first detection signal is output. The output period (pulse width) of the first detection signal can be written as $n/f_1 - (n+a)/f_0$.

Figure 5:
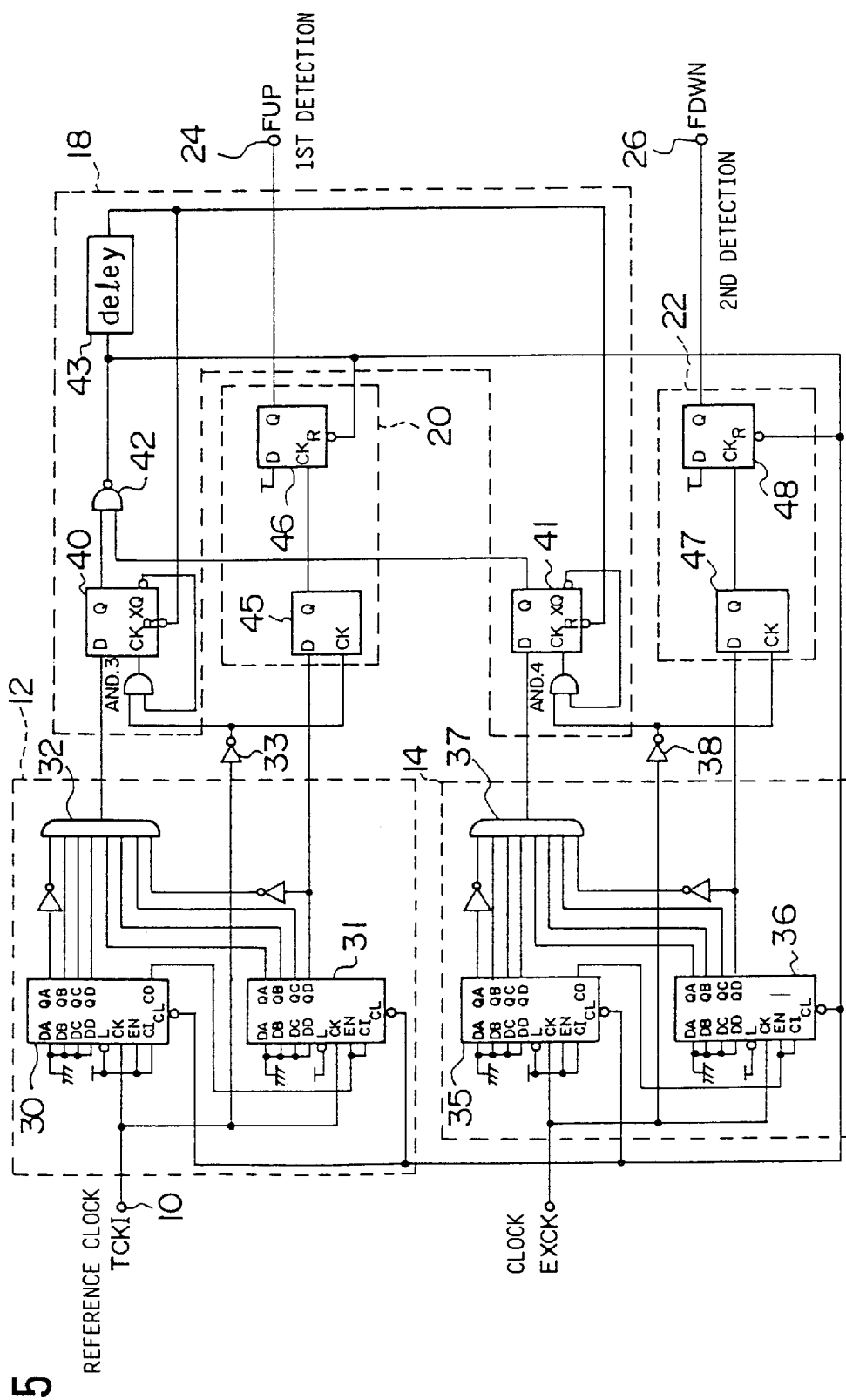
FIG. 5 is a circuit diagram of the frequency comparator shown in FIG. 1.

FIG. 5 is a circuit diagram of the frequency comparator shown in FIG. 1. In FIG. 5, parts that are the same as those shown in FIG. 1 are given the same reference numbers. The first counter 12 is supplied with the reference clock, and includes counters 30 and 31, AND gate 32 and inverters. A carry signal of the counter 30 which is output via its carry-out terminal is applied to a carry-in terminal of the counter 31. When n is equal to 126, the n detection signal which is at the high level is output by the AND,circuit 32. When (n+a) is equal to 128, the (n+a) detection signal which is at the high level is output via a data output terminal Q of the counter 31. The second counter 16 is supplied with the compared clock, and is made up of counters 35 and 36, an AND circuit 37 and inverters. A carry signal of the counter 35 which is output via its carry-out terminal is applied to a carry-in terminal of the counter 36. When n is equal to 126, the n detection signal which is at the high level is output by the AND circuit 37. When (n+a) is equal to 128, the (n+a) detection signal which is at the high level is output via a data output terminal $Q_D$ of the counter 36.

The reset circuit 18 is made up of D-type flip-flops 40 and 41, a NAND circuit 42, and a delay circuit 43. The flip-flops 40 and 41 respectively latch the n detection signals from the AND circuits 32 and 37 in synchronism with signals obtained by inverting the reference clock and the compared clock by inverters 33 and 38. This is intended to avoid hazard. The NAND circuit 42 generates the reset signal which is at the low level when the signals of the flip-flops 40 and 41 are both switched to the high level. The reset signal thus generated resets the counters 30, 31, 35 and 37 to zero, and resets D-type flip-flops 46 and 48 of the first and second hold circuits 20 and 22. The reset signal is delayed by a given time by the delay circuit 43, and the delayed signal resets the flip-flops 40 and 41 after the counters 30, 31, 35 and 37 are reset.

The first hold circuit 20 includes D-type flip-flops 45 and 46. The flip-flop 45 latches the (n+a) detection signal in synchronism with the output clock of the inverter 33. The flip-flop 46 receives the output signal of the flip-flop 45 as a clock input, and continuously receives a high-level data signal. The output signal of the flip-flop 46 is output via the terminal 24 as the first detection signal.

The second hold circuit 22 includes D-type flip-flops 47 and 48. The flip-flop 47 latches the (n +b) detection signal in synchronism with the output clock of the inverter 38. The flip-flop 48 receives the output signal of the flip-flop 47 as a clock input, and continuously receives a high-level data signal. The output signal of the flip-flop 48 is output via the terminal 25 as the second detection signal.

In the above-mentioned embodiment of the present invention, when the difference between the frequency $f_0$ and the frequency $f_1$ exceeds the given value (equal to a or b), the first and second detection signals having the pulse widths corresponding to the frequency difference are obtained, and are not affected by the phase difference between the signals of the frequencies $f_0$ and $f_1$.

If the first and second counters 12 and 16 are saturated at the respective count values (n+a) and (n+b), the first and second hold circuits 20 and 22 will be unnecessary. For example, the counters 12 and 16 are formed of 8-bit binary counters. If (n+a)=(n+b)=128, the 2" outputs of the binary counters are equal to 1 when the count values are equal to any of 128–255. Hence, as long as $f_0/2 < f_1 < 2f_0$ is satisfied, the binary counters can be considered as being of a saturation type.

In the above-mentioned embodiment of the present invention, the given values a and b are equal to 2 so that an insensitive range can be defined when the count values of the first and second counters 12 and 16 fall within the range from (n+a−1) to (n+b−1). As long as the count values fall within the insensitive range, the first and second detection signals are not output. Alternatively, it is possible to set the given values a and b equal to 0 and to thus employ no insensitive range.

Figure 6:
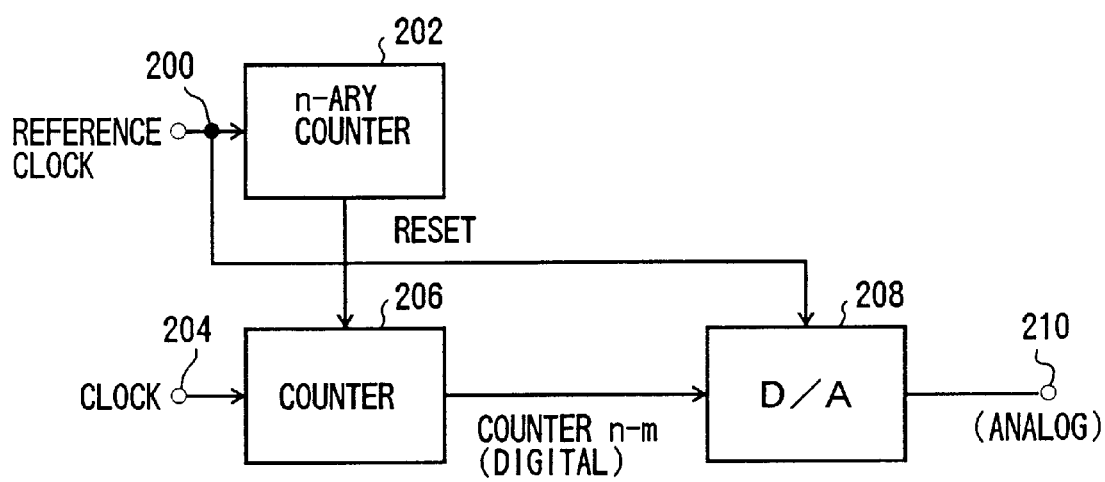
FIG. 6 is a block diagram of a clock regenerating device according to the present invention.
Figure 7:
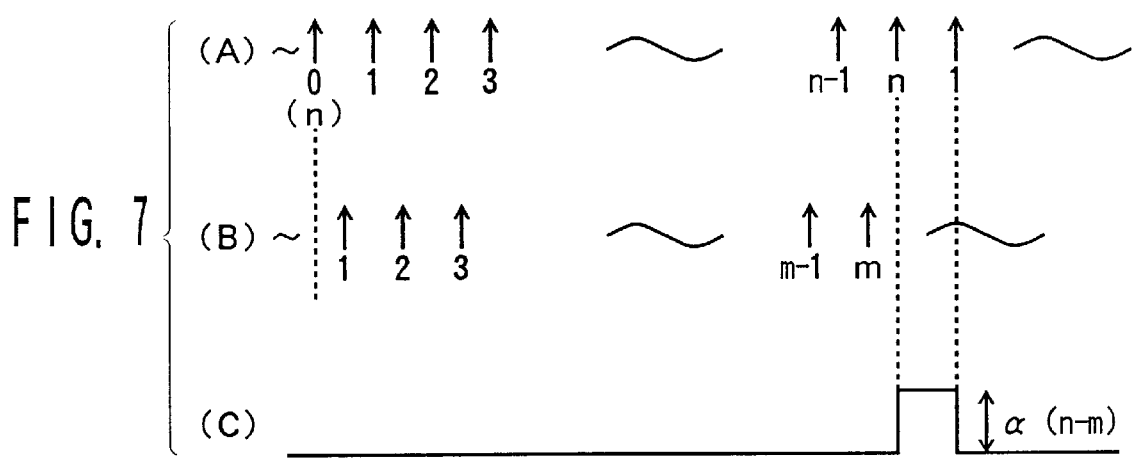
FIG. 7 is a timing chart of an operation of the clock regenerating device shown in FIG. 6.

FIG. 6 is a block diagram of a frequency comparator according to another embodiment of the present invention. A reference clock serving as a first clock shown in FIG. 7(A) is applied to a terminal 200, and is then applied to an n-array counter 202. A compared clock serving as a second clock shown in FIG. 7(B) is applied to a terminal 204, and is then applied to a counter 206. The counter 202 counts the reference clock and outputs a carry each time the count value becomes equal to n. The above carry is supplied, as a reset signal, to the counter 206. The counter 206 counts the compared clock, and supplies a D/A converter 208 with a digital value which is equal to the difference (n−m) where m denotes the count value obtained when the reset signal is supplied thereto. The D/A converter 208 converts the digital value (n−m) into an analog signal at the time of supply of the reference clock as shown in FIG. 7(C). The analog signal thus obtained is output via a terminal 210 as the first detection signal. The second detection signal can be generated in the same manner as described above.

Figure 8:
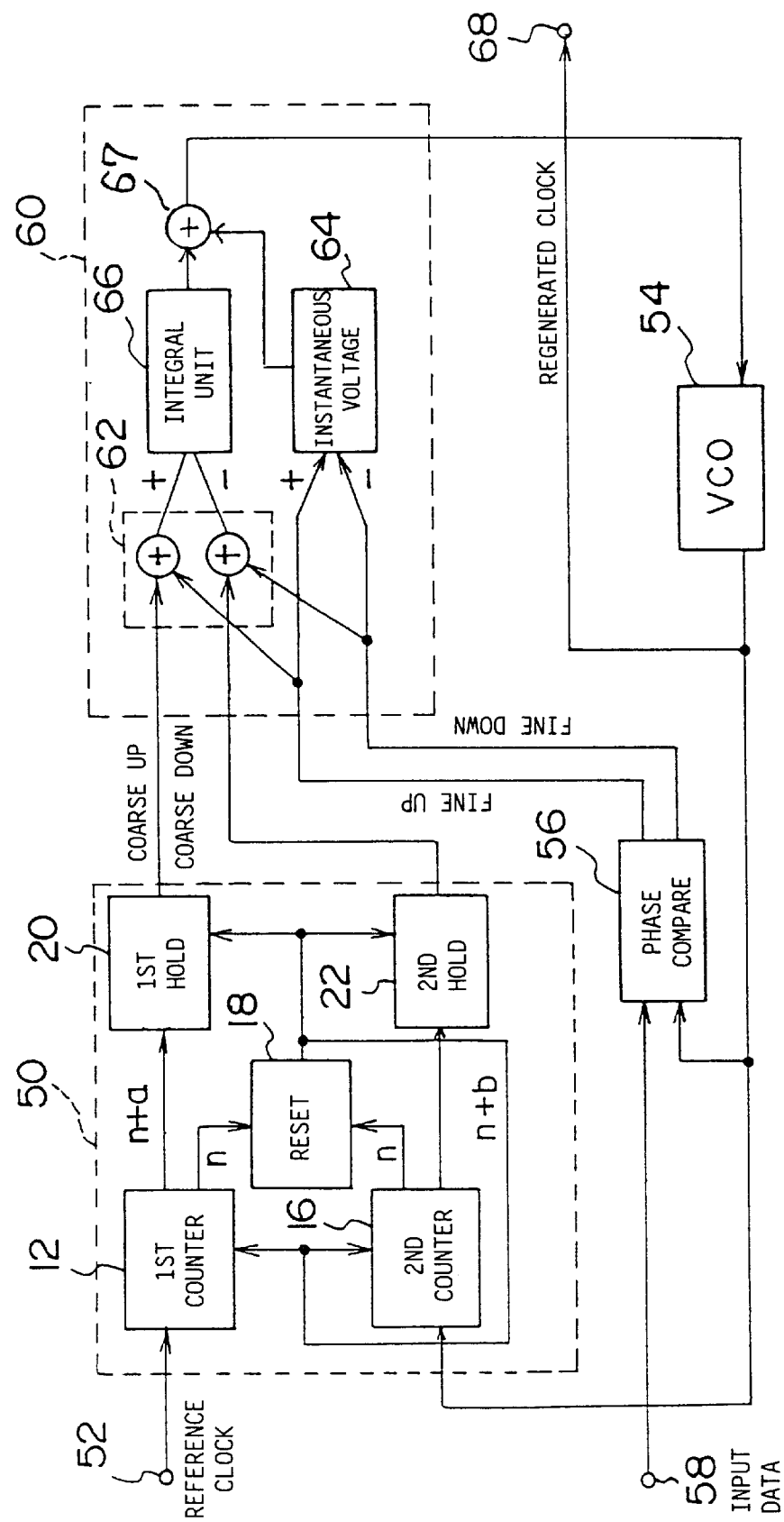
FIG. 8 is a block diagram of the clock regenerating device shown in FIG. 6 in more detail.

FIG. 8 is a block diagram of a clock regenerating device equipped with the frequency comparator shown in FIG. 1. A frequency comparator (FD) 50 shown in FIG. 8 has the configuration shown in FIG. 1. The reference clock applied to a terminal 52 is supplied to the first counter 12. The second counter 16 is supplied with the clock generated by a voltage-controlled oscillator (VCO) 54, which will be described later. The first and second detection signals respectively output by the first and second hold circuits 20 and 22 are supplied, as a coarse-adjustment up signal and a coarse-adjustment down signal, to an adder unit 62 provided in a combining circuit 60.

A phase comparator (PD) 56 compares the phase of the output clock from the VCO 54 with the phase of input data incoming via a terminal 58, and a fine-adjustment up signal and a fine-adjustment down signal to the adder unit 62 and an instantaneous voltage generating unit 64 provided in the combining unit 60. The adder unit 62 subtracts the coarse-adjustment down signal and the fine-adjustment down signal from the coarse-adjustment up signal and the fine-adjustment up signal, and supplies the resultant signals to an integral unit 66. The integral unit 66 integrates the two output signal voltages from the adder unit 62. The integrated voltage corresponds to a frequency control component for the VCO 54, and is supplied to a mixing unit 67. The instantaneous voltage generating unit 64 generates an instantaneous voltage as the frequency control component for the VCO 54, the instantaneous voltage functioning to increase the voltage in accordance with the fine-adjustment up signal and decrease the voltage in accordance with the fine-adjustment down signal. The above instantaneous voltage is supplied to the mixing unit 67. The mixing unit 67 mixes (adds) the integrated voltage output by the integral unit 66 and the instantaneous voltage output by the instantaneous voltage generating unit 64, and supplies a resultant control voltage to the VCO 54. The VCO increases the oscillation frequency as the control voltage increases so as to generate the clock having the frequency and phase corresponding to the control voltage. The clock thus generated is output via a terminal 68. The coarse-adjustment up and down signals have a phase response weaker than that of the fine-adjustment up and down signals, and have a frequency response stronger than that of the fine-adjustment up and down signals. The above means that the following is satisfied:

$$\Delta pf/\Delta ff < \Delta pc/\Delta fc$$

where $\Delta pc$ and $\Delta fc$ respectively denote a phase variation and a frequency variation in the output of the VCO 54 due to activation (the high level in the embodiment being concerned) of the coarse-adjustment up and down signals per unit time, and $\Delta pf$ and $\Delta ff$ respectively denote a phase variation and a frequency variation in the output of the VCO 54 due to activation (the high level in the embodiment being concerned) of the fine-adjustment up and down signals per unit time.

The phase variation results from a frequency variation which takes place while the coarse-adjustment or fine-adjustment up and down signals are activated. The frequency variation results from a variation in the output of the integral unit 66 which takes places while the coarse-adjustment or fine-adjustment up and down signals are activated, and is maintained even after the above signals are inactivated.

Figure 9:
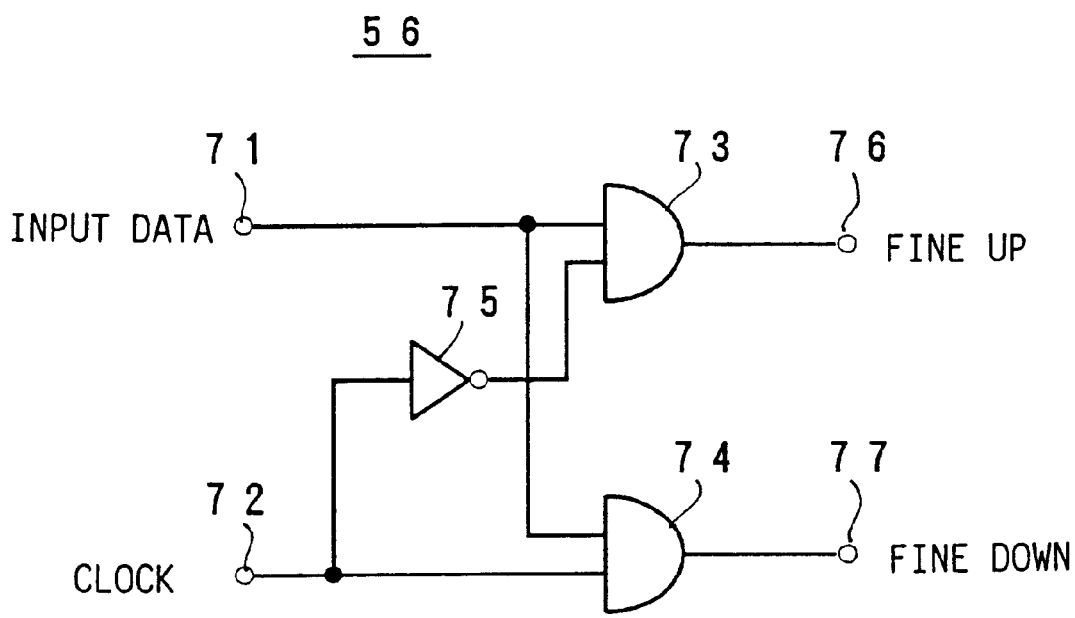
FIG. 9 is a circuit diagram of a phase comparator.

FIG. 9 is a circuit diagram of the phase comparator 56. The input data is applied to AND circuits 73 and 74 via a terminal 71. The output clock of the VCO 54 is applied to a terminal 72, and is supplied to the AND circuit 74 and an inverter 75. The inverted signal from the inverter 75 is supplied to the AND circuit 73.

If the phase of the input data leads to that of the clock, the AND circuit 73 generates a pulse having a pulse width corresponding to the phase difference from the rising edge of the input data to the rising edge of the clock. The pulse thus generated is output via a terminal 76 as the fine-adjustment up signal. The AND circuit 74 generates a pulse having a pulse width corresponding to the phase difference from the rising edge of the clock to the falling edge of the input data. The pulse thus generated is output via a terminal 77 as the fine-adjustment down signal.

Figure 10:
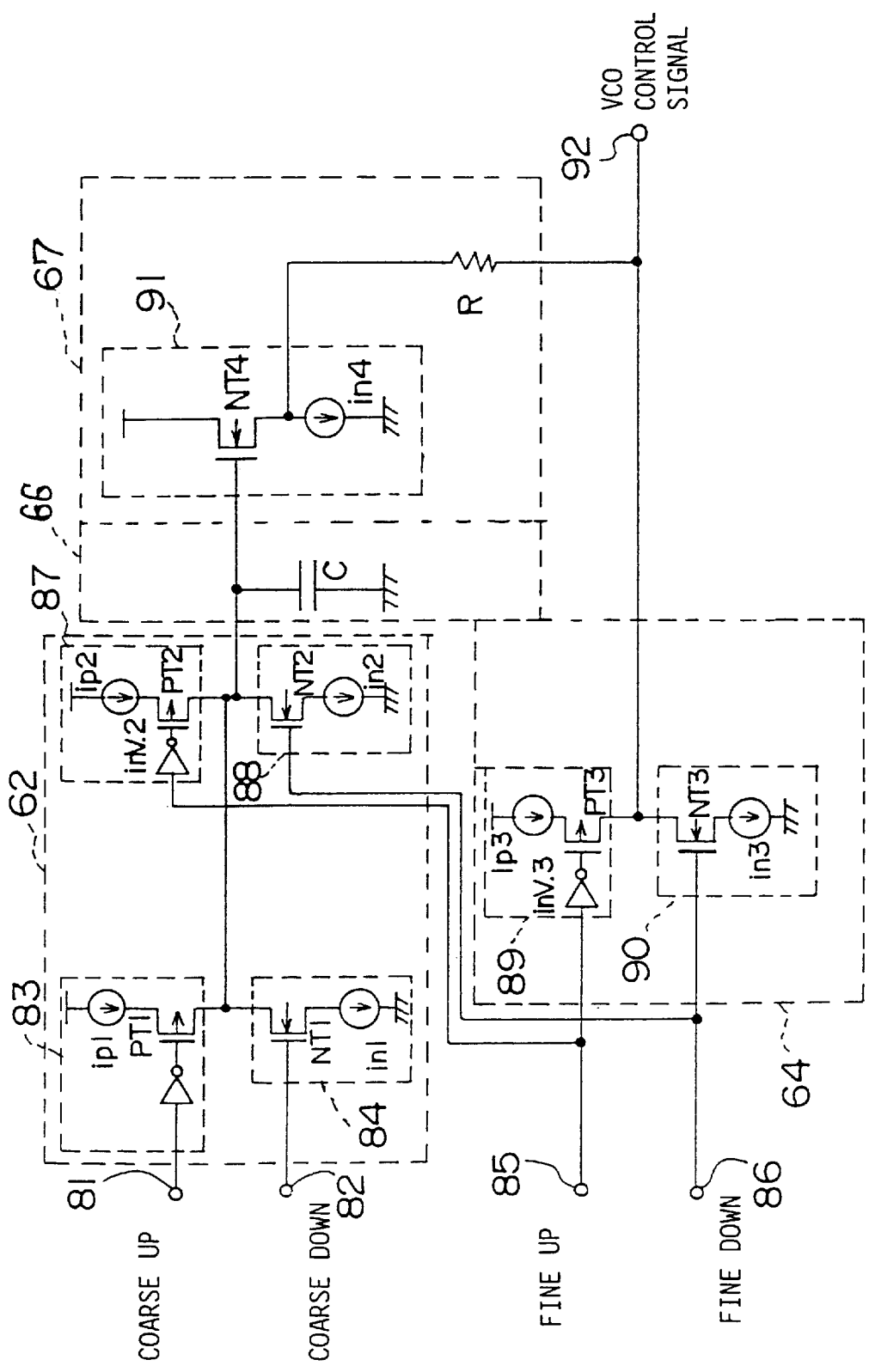
FIG. 10 is a circuit diagram of a filter unit.

FIG. 10 is a circuit diagram of the combining unit 60. The coarse-adjustment up signal and the coarse-adjustment down signal are respectively applied to terminals 81 and 82, and are supplied to first and second current switches 83 and 94 provided in the adder unit 62. The fine-adjustment up signal and the fine-adjustment down signal are respectively applied to terminals 85 and 86, and are supplied to third and fourth current switches 87 and 88 provided in the adder unit 62 and fifth and sixth current switches 89 and 90 provided in the instantaneous voltage generating unit 64.

The first current switch 83 inverts the coarse-adjustment up signal, and supplies the inverted signal to the gate of a P-channel MOS transistor PT1. A capacitor C of the integral unit 66 is charged by a constant-current source ip1 during the high-level period of the coarse-adjustment up signal. The second current switch 84 supplies the coarse-adjustment down signal to the gate of an N-channel MOS transistor NT1. The capacitor C is discharged by a constant-current source in1 during the high-level period of the coarse-adjustment down signal.

The third current switch 87 inverts the fine-adjustment up signal, and supplies the inverted signal to the gate of a P-channel MOS transistor PT2. The capacitor C is charged by a constant-current source ip2 during the high-level period of the fine-adjustment up signal. The fourth current switch 88 supplies the fine-adjustment down signal to the gate of an N-channel MOS transistor NT2. The capacitor C1 is discharged by a constant-current source in2 during the high-level period of the fine-adjustment down signal.

The fifth current switch 89 inverts the fine-adjustment up signal, and supplies the inverted signal to the gate of a P-channel MOS transistor PT3. Hence, a current flows, during the high-level period of the fine-adjustment up signal, in a resistor R of the integral unit 66 by a constant-current source ip3 so that the output voltage is increased. The sixth current switch 90 supplies the fine-adjustment down signal to the gate of an N-channel MOS transistor NT4. A current flows, during the high-level period of the fine-adjustment down signal, in the resistor R by a constant-current source in3 so that the output voltage is decreased.

The integral unit 66 includes the capacitor C, which integrates the signal supplied from the adder unit 62. The capacitor C is connected to a buffer 91 of a source-follower structure made up of the N-channel MOS transistor NT4 and the constant-current source in4. The buffer 91 functions as the mixing unit 67. Hence, the voltage developed across the capacitor C is not affected when the current switches 89 and 90 of the instantaneous voltage generating unit 64 cause the current to flow in the resistor R. Hence, the VCO control signal which corresponds to the sum of the output voltage of the buffer 91 and the voltage developed across the resistor R in which the current flows can be obtained at a terminal 92.

The VCO control voltages now labeled $V_{CNT}$ respectively obtained by the embodiment of the present invention and the prior art can be expressed as follows:

$$V_{CNT} = I_F \cdot R + (1/C) \int (I_C + I_F) dt \quad (1)$$

$$V_{CNT} = (I_C + I_F) \cdot R + (1/C) \int (I_C + I_F) dt \quad (2)$$

where IC denotes the current generated by the current switches 83 and 84 by the coarse-adjustment up and down signals, and $I_F$ denotes the current generated by the current switches 87 and 88 or 89 and 90 by the fine-adjustment up and down signals. The VCO control voltage expressed by equation (1) is generated by the embodiment of the present invention. The VCO control voltage expressed by equation (2) is generated by the prior art.

The first term of equation (1) is an instantaneous value as a phase control component depending on only the fine adjustment signals, and the second term thereof is a frequency control component depending on the integrated value of the sum of the coarse adjustment signals and the fine adjustment signals. The present invention is directed to pulling the regenerated clock output by the VCO 54 in phase with the input data, and is not required to pull the regenerated clock in phase with the reference clock. This is because there is no phase relationship between the input data and the reference clock. It can be seen from equation (1) that the above object of the present invention is achieved.

Equation (2) indicating the operation of the prior device differs from equation (1) in that the first term of equation (2) depends on the sum of the coarse adjustment signals and the fine adjustment signals. That is, there is no phase relationship between the input data and the reference clock, nevertheless the device operates so that the regenerated clock is pulled in phase with the reference clock. Hence, the above operation prevents the regenerated clock from being pulled in phase with the input data.

Figure 11:
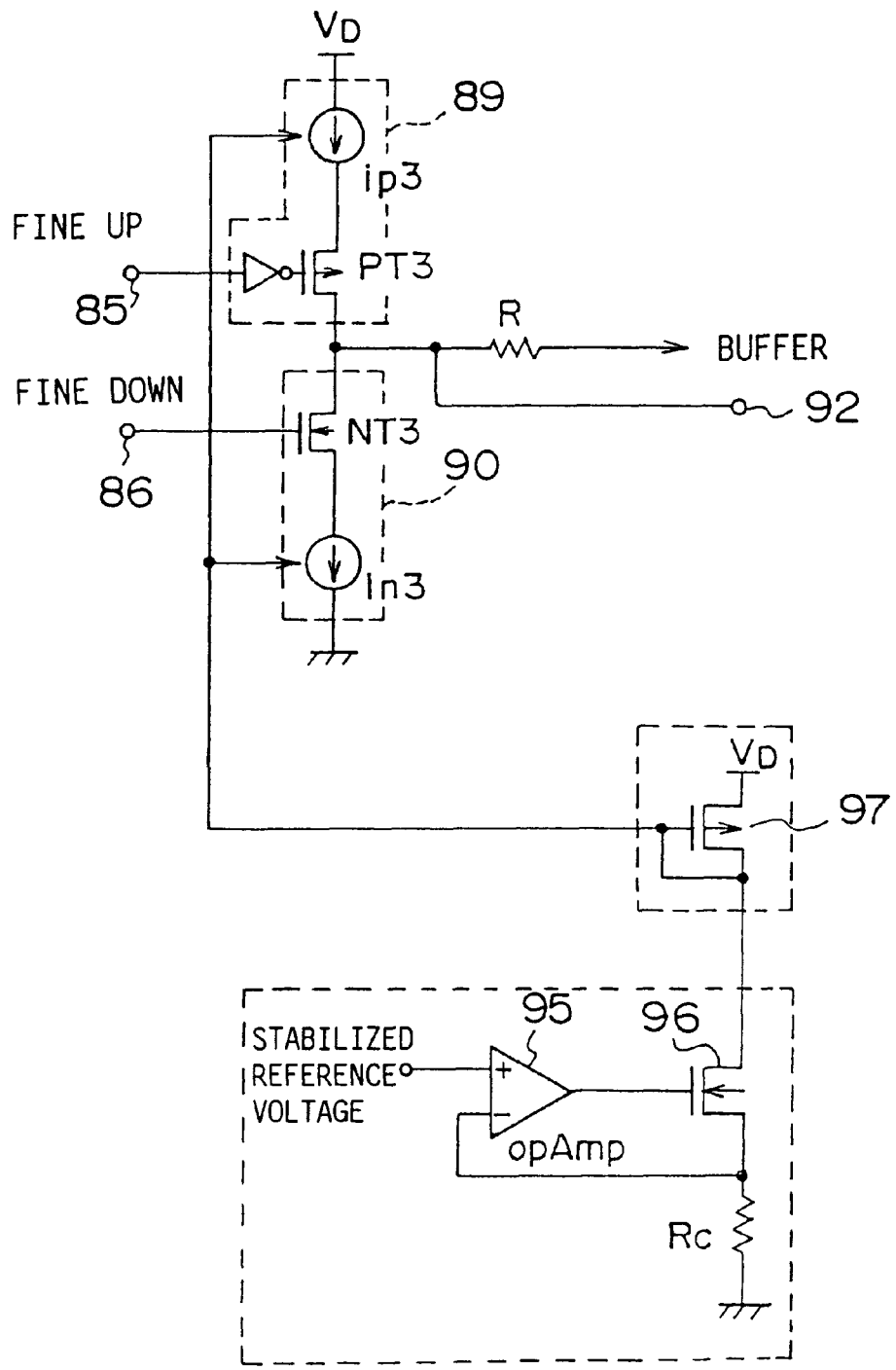
FIG. 11 is a circuit diagram of current switch.

The constant-current sources ip3 and in3 of the current switches 89 and 90 may be configured as shown in FIG. 11. In FIG. 11, a stabilized reference voltage is supplied to the non-inverting input terminal of an operational amplifier 95, and the output signal thereof is applied to the gate of an N-channel MOS transistor 96. The source of the transistor 96 is grounded via a resistor Rc formed in a semiconductor chip on which the clock regenerating device is formed, and is connected to the inverting input terminal of the operational amplifier 95. The drain current of the transistor 96 is supplied from a P-channel MOS transistor 97. The transistor 97 forms current-mirror circuits in cooperation with the constant-current sources ip3 and in3.

If the resistor R has a resistance deviation, the resistor Rc formed on the same chip as the resistor R will have an identical resistance deviation. The operational amplifier 95 controls the drain current of the transistor 96 so that the voltage drop developed across the resistor Rc is constant. The above control of the drain current varies the magnitudes of the currents of the constant-current sources ip3 and in3. The voltage drops developed across the resistor R when the currents of the constant-current sources ip3 and in3 respectively flow through the resistor R is made constant irrespective of variations and deviations in temperature, power supply voltage and/or production process. The first, second, third and fourth current switches 83, 84, 87 and 88 employ constant-current sources independent of the resistor Rc. With the above-mentioned arrangement, the performance of the PLL loop characteristics can be stabilized and the clock can stably be regenerated.

Figure 12:
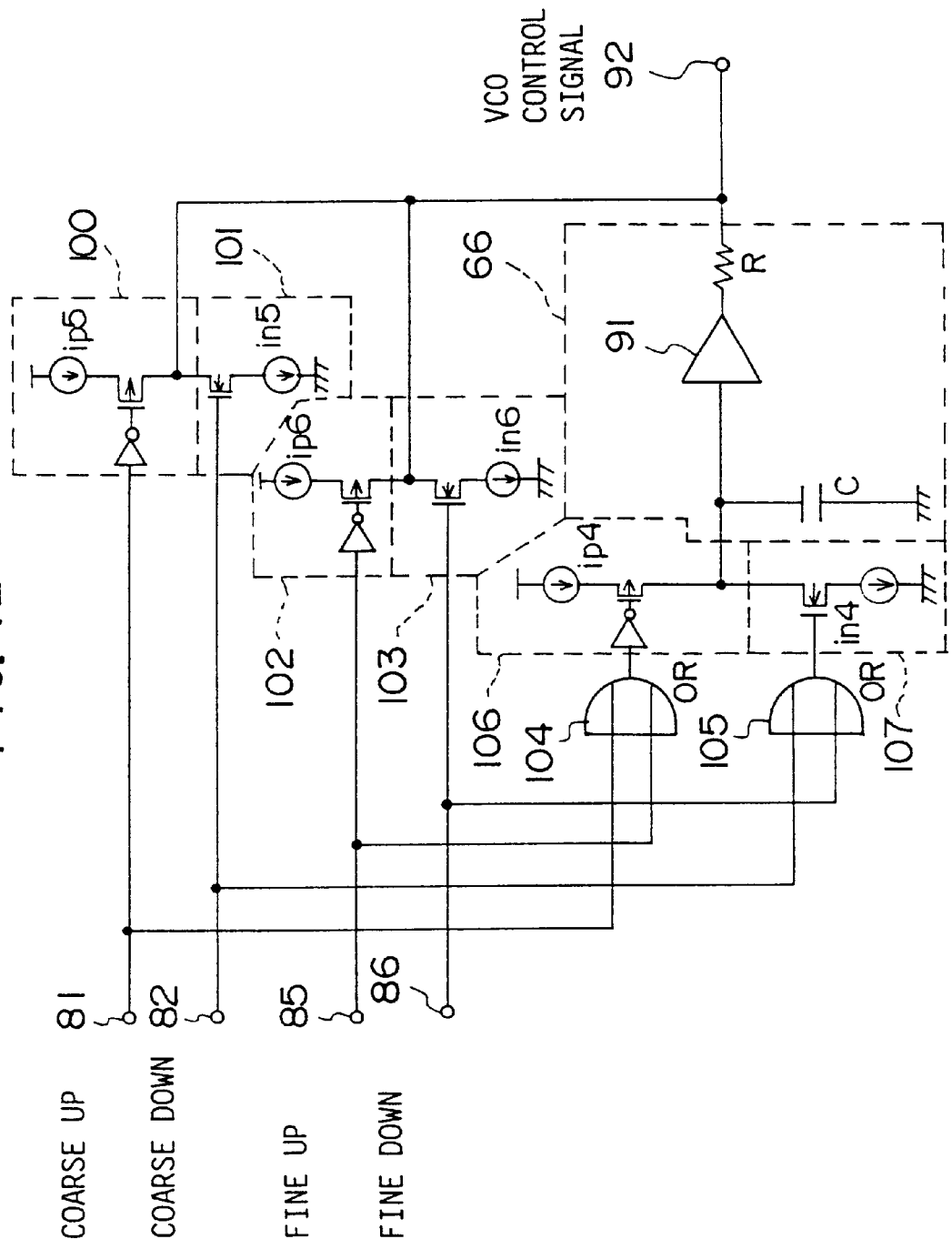
FIG. 12 is a circuit diagram of another configuration of the filter unit.

FIG. 12 is a circuit diagram of a variation of the combining unit 60. The coarse-adjustment up signal and the coarse-adjustment down signal are respectively applied to terminals 81 and 82, and are supplied to current switches 100 and 101 forming an instantaneous voltage generating circuit, and to OR circuits 104 and 105 forming an adder unit. The fine-adjustment up signal and the fine-adjustment down signal are respectively applied to terminals 85 and 86, and are supplied to current switches 102 and 103 forming the instantaneous voltage generating circuit 64 and OR circuits 106 and 107.

The fifth current switch 106 inverts the coarse-adjustment up signal, and supplies the inverted signal to the gate of the P-channel MOS transistor PT1. A constant-current source ip4 charges the capacitor C of the integral unit 66 during the high-level period of the coarse-adjustment up signal or the fine-adjustment up signal. The sixth current switch 107 supplies the coarse-adjustment down signal to the gate of the N-channel MOS transistor in4, and the capacitor C is discharged by the constant-current source in4 during the high-level period of the coarse-adjustment down signal or the fine-adjustment down signal.

The current switches 100 and 102 respectively invert the coarse-adjustment and fine-adjustment up signals, and applies the inverted signals to the gates of respective P-channel MOS transistors. Hence, currents flow, during the high-level periods of the signals, through the resistor R of the integral unit 66 by constant-current sources ip5 and ip6 so that the output voltage is increased. The current switches 101 and 103 supply the coarse-adjustment and fine-adjustment down signals to the gates of respective N-channel MOS transistors. Hence, currents flow, during the high-level periods of the signals, through the resistor R by constant-current sources in5 and in6 so that the output voltage is decreased.

The currents of the constant-current sources have the following relationships:

$ip4=in4$ $ip5=in5<ip6=in6.$

Figure 13:
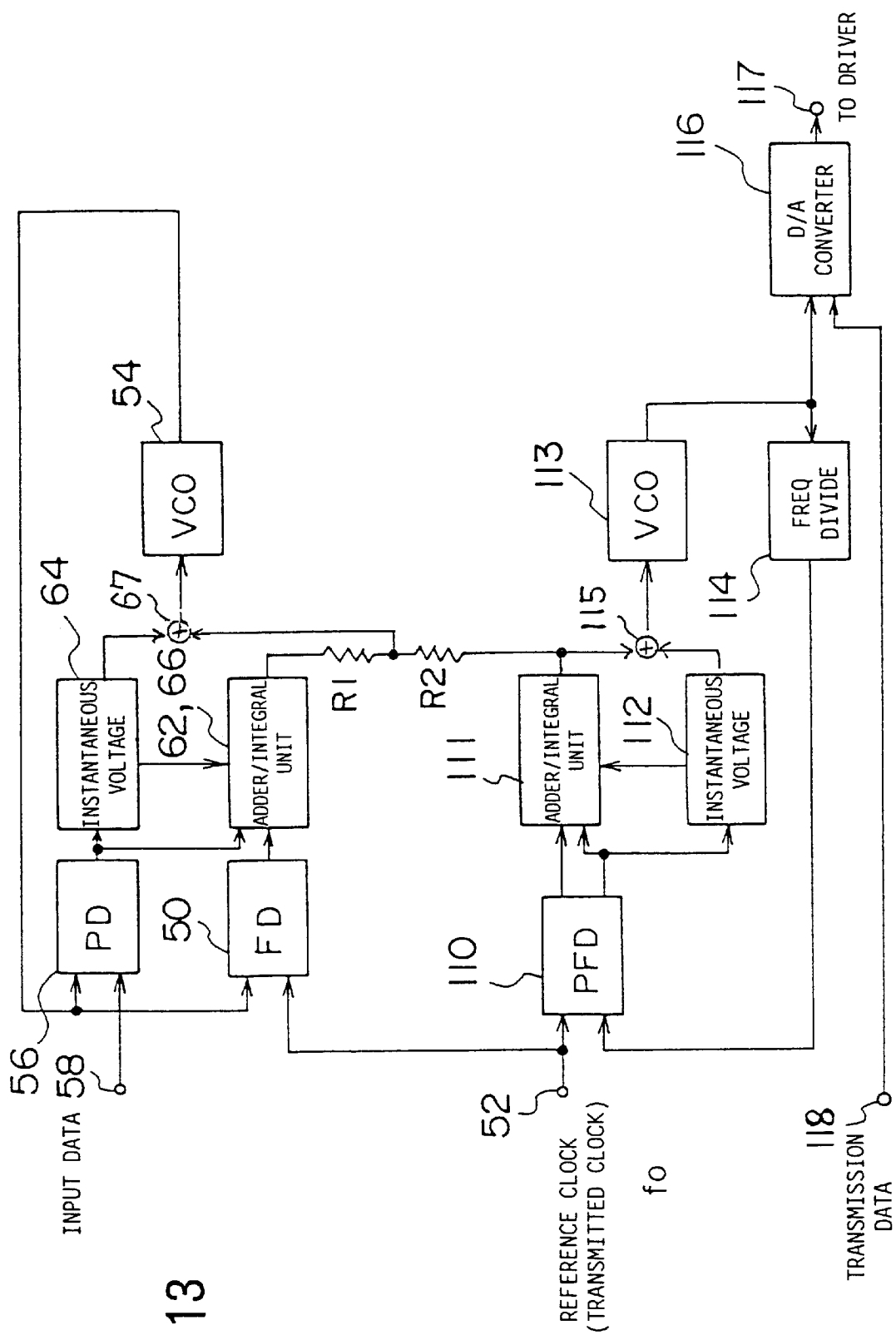
FIG. 13 is a block diagram of another clock regenerating device.

In the present variation, the frequency variations commonly own the constant-current sources 106 and 107 for the coarse and fine adjustments, and the following relationships stand:

$\Delta ff = \Delta fc$ $\Delta pf < \Delta pc.$ $(\Delta pf / \Delta ff) < (\Delta pc / \Delta fc).$ It will be noted that a large area for forming the capacitor C of the integral unit 66 will be occupied on the semiconductor chip. FIG. 13 shows an embodiment of the present invention directed to reducing the capacitor C (the capacitance thereof). In FIG. 13, parts that are the same as those shown in FIG. 10 are given the same reference numbers.

Referring to FIG. 13, the output terminal of the integral unit 66 is connected to a resistor R1, to which a resistor R2 is connected, so that a voltage dividing circuit is thus formed. The resistor R2 is connected to an output terminal of an adder/integral unit 111. A connection node at which the resistors R1 and R2 are connected in series is connected to the VCO 54. A phase/frequency comparator (PFD) 110 compares the phase and frequency of the reference clock supplied via the terminal 52 with those of the clock supplied from a frequency divider 114, and outputs coarse-adjustment and fine-adjustment up and down signals to the integral unit 111. The fine-adjustment up and down signals from the comparator 110 are also supplied to an instantaneous voltage generating circuit 112. The adder/integral unit 111 adds the coarse-adjustment and fine-adjustment up and down signals and also integrates these signals. The instantaneous voltage generating circuit 112 generates an instantaneous voltage in accordance with the fine-adjustment up and down signals. A mixing unit 115 mixes the integrated value output by the adder/integral unit 111 with the instantaneous voltage, and thus generates a VCO control signal. The above-mentioned comparator 110, the adder/integral unit 111 and the instantaneous voltage generating circuit 112 respectively have the same structures as those of the aforementioned frequency comparator (FD) 50, the phase comparator (PD) 56, the instantaneous voltage generating circuit 64, the adder unit 62 and the integral unit 66.

The VCO control signal output by the adder/integral unit 111 is supplied to a VCO 113, which generates a sampling clock synchronized with the reference clock. The sampling clock is supplied to a frequency divider 114 and a D/A converter 116. The frequency divider 114 frequency-divides the sampling clock at a given frequency dividing ratio so that a clock having a frequency approximately equal to that of the reference clock is generated and supplied to the comparator 110. Hence, a PLL is configured. The D/A converter 116 converts transmission data supplied via a terminal 118 by the above sampling clock into an analog signal, which is then output via a terminal 117.

The adder unit 62, the integral unit 66 and the adder/integral unit 111 have the respective VCO control signals having an approximately identical level. Hence, the control signal level of the integral unit 66 is divided by the resistors R1 and R2 with respect to the output (reference) level of the adder/integral unit 111. The divided voltage is thus applied to the VCO 113. Thus, it is possible to reduce the capacitor C of the integral unit 66.

A further description will be given of reduction in the capacitor C.

Figure 14A:
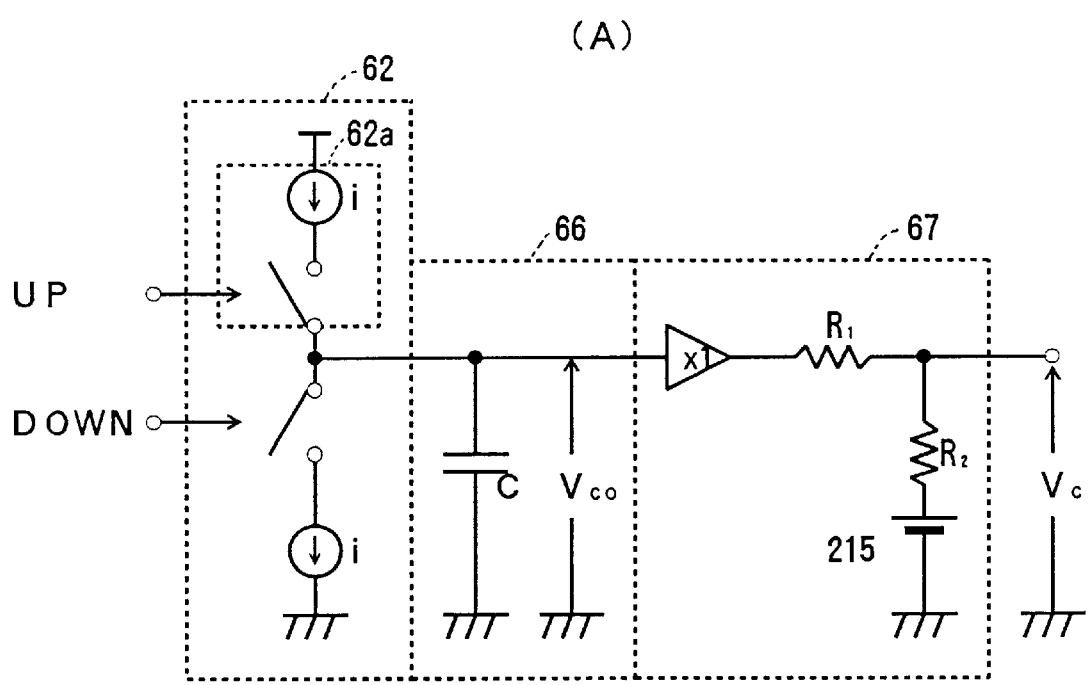
FIG. 14A is an equivalent circuit diagram of an adder unit, an integral unit and a mixing unit shown in FIG. 13.
Figure 14B:
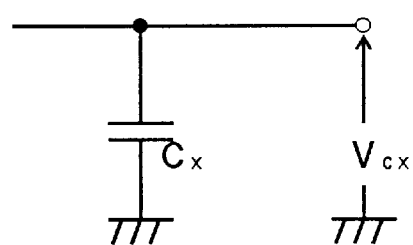
FIG. 14B is an equivalent circuit diagram of an integral unit and a mixing unit shown in FIG. 14A.

The adder unit 62, the integral unit 66 and the mixing unit 67 shown in FIG. 13 can equivalently be depicted as shown in FIG. 14A. A current switch 62a corresponds to the current switches 83 and 87, and a voltage source 215 corresponds to the voltage from the adder/integral unit 111. It will now be assumed that the voltage developed across the capacitor C is denoted as $V_{CO}$, and the voltage of the connection node between the resistors R1 and R2 is denoted as $V_C$. The integral unit 66 and the mixing unit 67 shown in FIG. 14A are equivalently be shown by a capacitor $C_X$ of a voltage $V_{CX}$. In this case, the following condition stands:

$$C_X = C \cdot (R1+R2)/R2.$$

Figure 15:
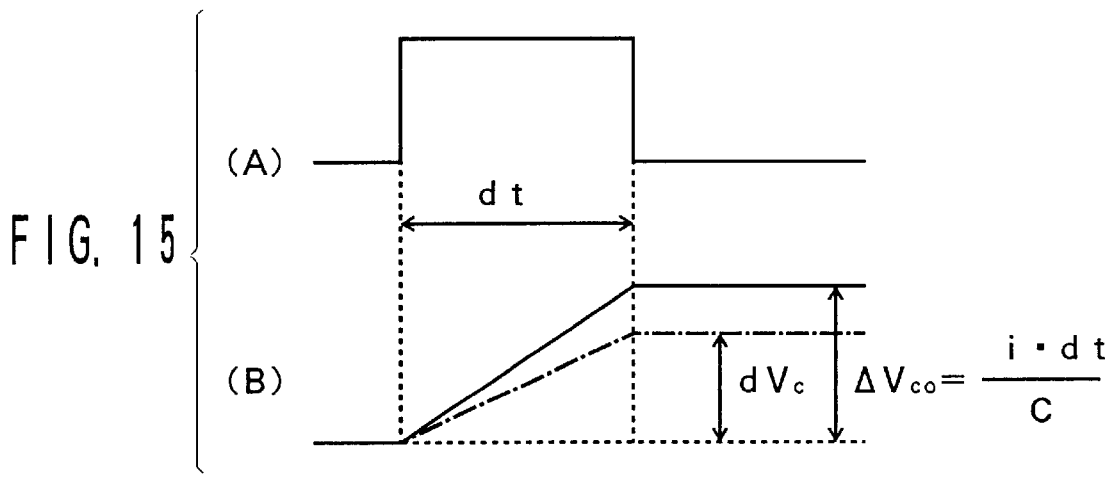
FIG. 15 is a waveform diagram showing the principle of reduction in a capacitor shown in FIG. 14A.

When the current switch 62a is turned ON for time dt corresponding to the high-level period of a signal shown in FIG. 15(A) and the capacitor C is charged by current i, an increase $dV_{CO}$ of the voltage $V_{CO}$, an increase $dV_C$ of the voltage $V_C$, and an increase $dV_{CX}$ of the voltage $V_{CX}$ shown in FIG. 15(B) are expressed as follows:

$$dV_{CO} = i \cdot dt/C.$$

The following is obtained when signal amplitudes in ac formation are considered:

$$dV_C = dV_{CO} \cdot R2/(R1+R2)$$

and thus $$\begin{aligned} dV_C &= i \cdot dt \cdot R2/((R1+R2) \cdot C) \\ &= i \cdot dt/((R1+R2) \cdot C/R2) \\ &= i \cdot dt/Cx \\ &= dV_{CX}. \end{aligned}$$

It can be seen from the above that the voltage dividing arrangement using the resistors R1 and R2 increases the capacitance of the capacitor C.

The end of the resistor R2 is required to be maintained at a constant potential. A transmitter/receiver device equipped with the clock regenerating device has a transmission data output circuit. The level of the VCO control signal output by the adder/integral unit 111 of the PLL substantially to the above constant potential. Hence, the components provided in the system from the comparator 110 to the frequency divider 114 are present in the transmitter/receiver device. In other words, part of the circuit shown in FIG. 13 can be configured by using the existing components of the transmitter/receiver device.

Figure 16:
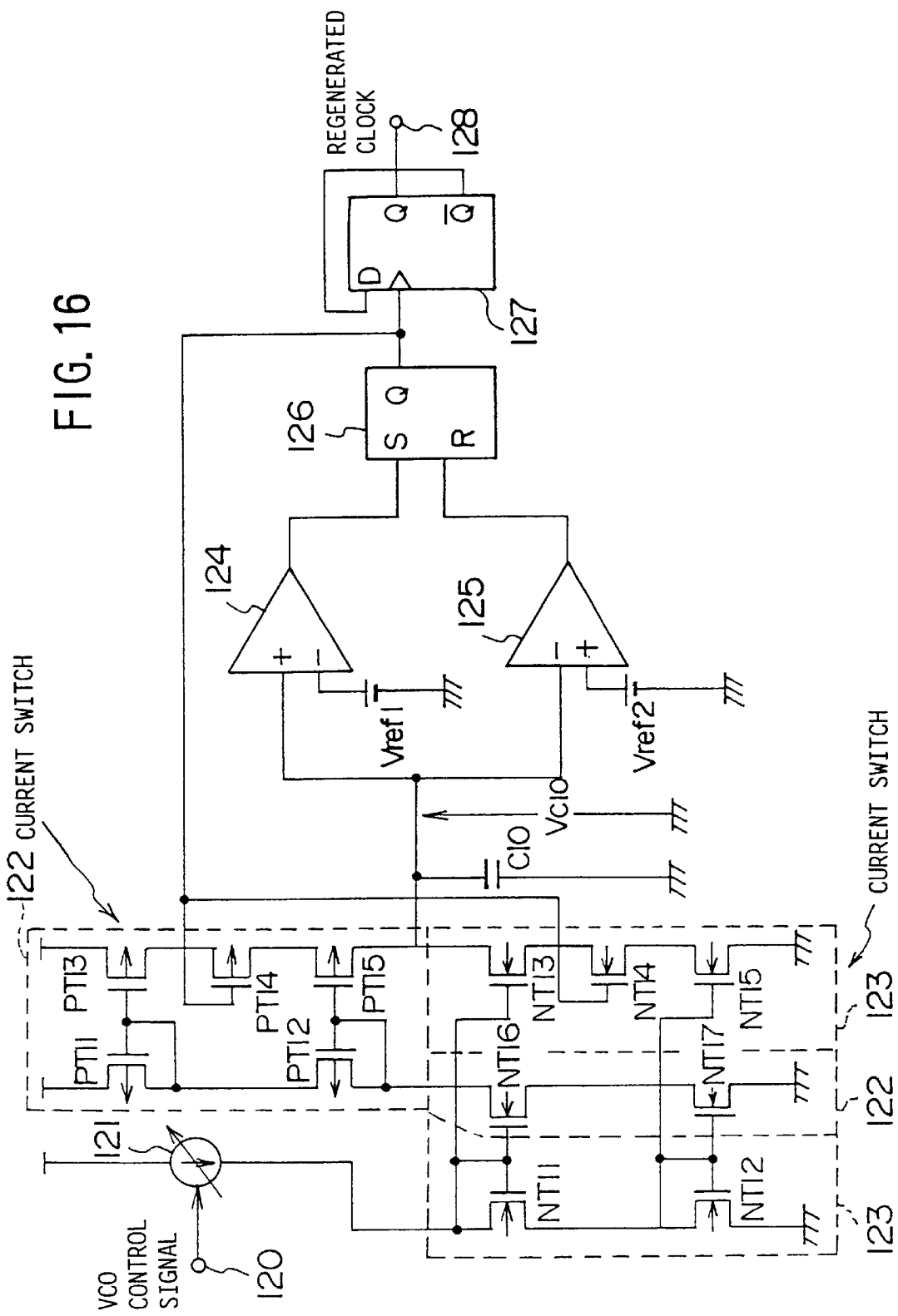
FIG. 16 is a circuit diagram of a voltage-controlled oscillator.
Figure 17:
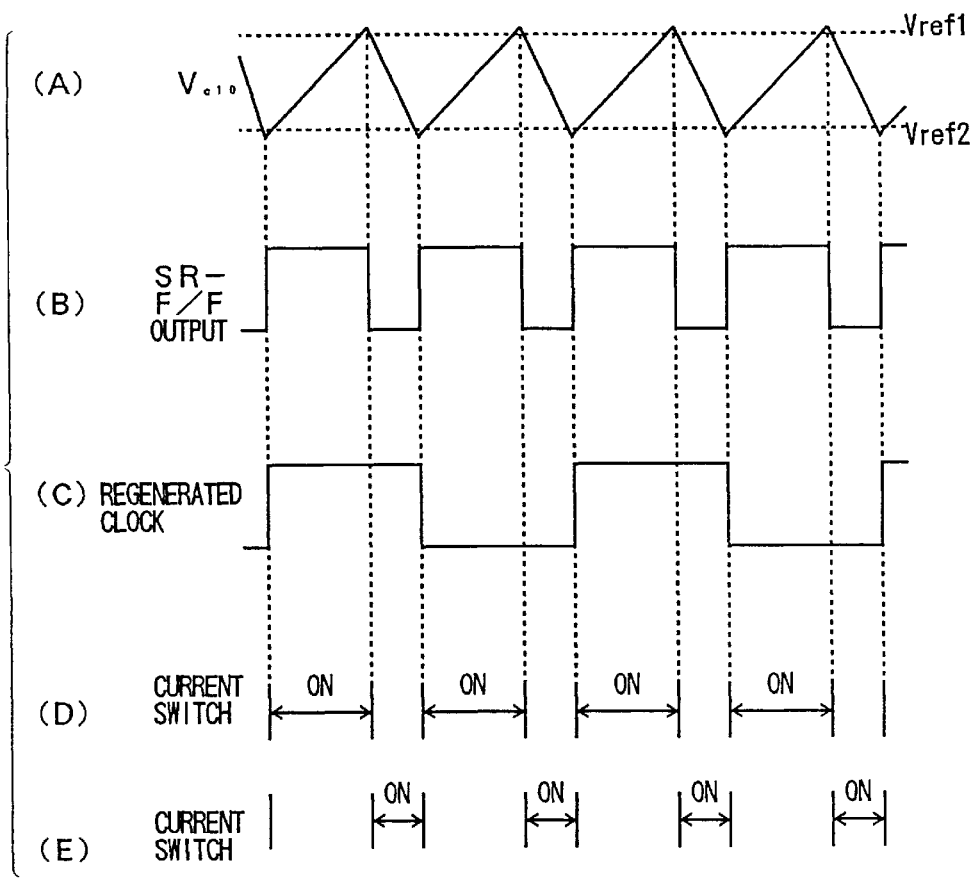
FIG. 17 is a timing chart of an operation of the filter unit shown in FIG. 12.

FIG. 16 is a circuit diagram of the VCO 54. The VCO control signal generated by the combining unit 60 is applied, via a terminal 120, to a voltage-to-frequency (V/I) converter 121. The converter 121 generates a current dependent on the voltage of the VCO control signal. Currents corresponding to the current generated by the converter 121 flow in charge current switches 122 and 123 in current-mirror formation. Each of the current switches 122 and 123 alternately turns ON and OFF in response to an output clock of an SR-type flip-flop 126, as shown in FIGS. 17(D) and 17(E), so that a capacitor C10 is charged and discharged. Hence, the voltage $V_{C10}$ of the capacitor C10 is changed as shown in FIG. 17(A), and is compared with reference voltages $V_{ref1}$ and $V_{ref2}$ by comparators 124 and 125. The SR-type flip-flop 126 is set and reset by the output signals of the comparators 124 and 125. The output clock of the SR-type flip-flop 126 shown in FIG. 17(B) is supplied to the current switches 122 and 123 and to a D-type flip-flop 127, which frequency-divides the output signal of the flip-flop 126 at a frequency dividing ratio of 1/2. Hence, a regenerated clock having a duty ratio of 50% as shown in FIG. 17(C) is available at a terminal 128.

A detailed description will now be given of the current switches 122 and 123. The output current of the V/I converter 121 flows N-channel MOS transistors NT11 and NT12 of the current switch 123. The transistor NT11 forms current-mirror circuits in cooperation with N-channel MOS transistors NT13 and NT16. The transistor NT12 forms current-mirror circuits in cooperation with N-channel MOS transistors NT15 and NT17. An N-channel MOS transistor NT14 is cascaded between the transistors NT13 and NT14, and has a gate supplied with the output clock of the flip-flop 126.

The drain currents of the transistors NT16 and NT17 are supplied via P-channel MOS transistors PT11 and PT12, which form current-mirror circuits in cooperation with P-channel MOS transistors PT13 and PT15. A P-channel MOS transistor PT14 is cascaded between the transistors PT13 and PT15, and has a gate supplied with the output clock of the flip-flop 126. The drains of the transistors PT13 and NT13 are connected to the capacitor C10.

The fine current-mirror operation can be realized by the cascaded current-mirror current sources (the current switch 122 includes the transistors PT11, PT13, PT12, PT15, and the current switch 123 includes the transistors NT11, NT13, NT12 and NT15). In this case, the gate-source voltages of the transistors PT13 and NT15 primarily determines the magnitude of the output current, and the transistors PT15 and NT13 function additionally. Hence, the switching transistors PT14 and NT14 can be provided on the source sides of the transistors PT13 and NT15. Hence, switching noise can be absorbed to a certain extent due to the presence of the transistors PT15 and NT13 provided between the switching transistors PT14 and NT14 and the capacitor C10.

A description will now be given, with reference to FIGS. 18 and 19, of a variation of the current switch using the current-mirror current source having a pair of transistors.

Figure 18:
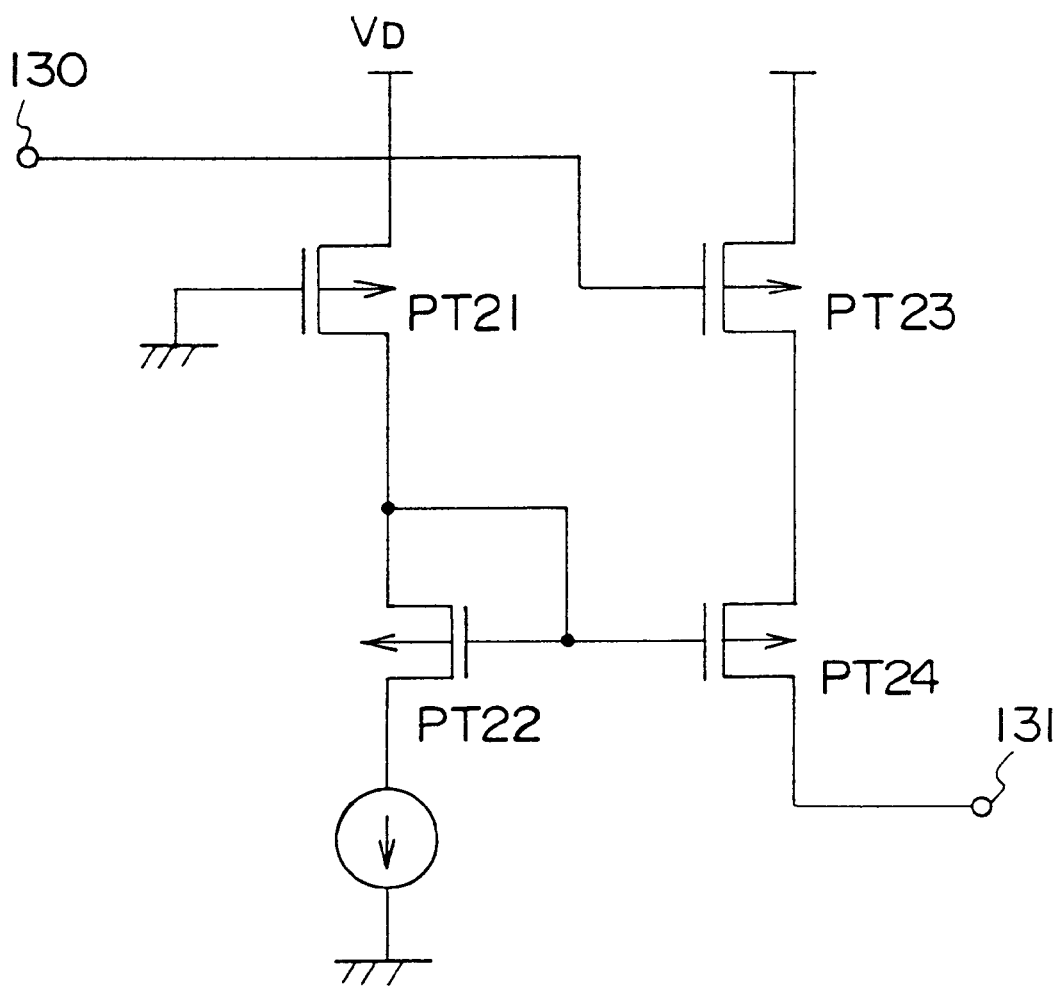
FIG. 18 is a circuit diagram of a current switch.

FIG. 18 is a circuit diagram of a variation of the current switch 122. Referring to FIG. 18, P-channel MOS transistors PT22 and PT24 form a current-mirror circuit. The source of the transistor PT24 is connected to the drain of a P-channel MOS transistor PT23. The gate of the transistor PT23 is supplied with a clock for switching via a terminal 130. The drain of the transistor PT24 is coupled to the capacitor via a terminal 131. A P-channel MOS transistor PT21 having a drain connected to the source of the transistor PT22 is provided to be balanced on the transistor PT23, and is always ON. Hence, the drain-source voltages of the transistors forming the current-mirror circuit are made substantially identical on both input and output sides thereof.

Figure 19:
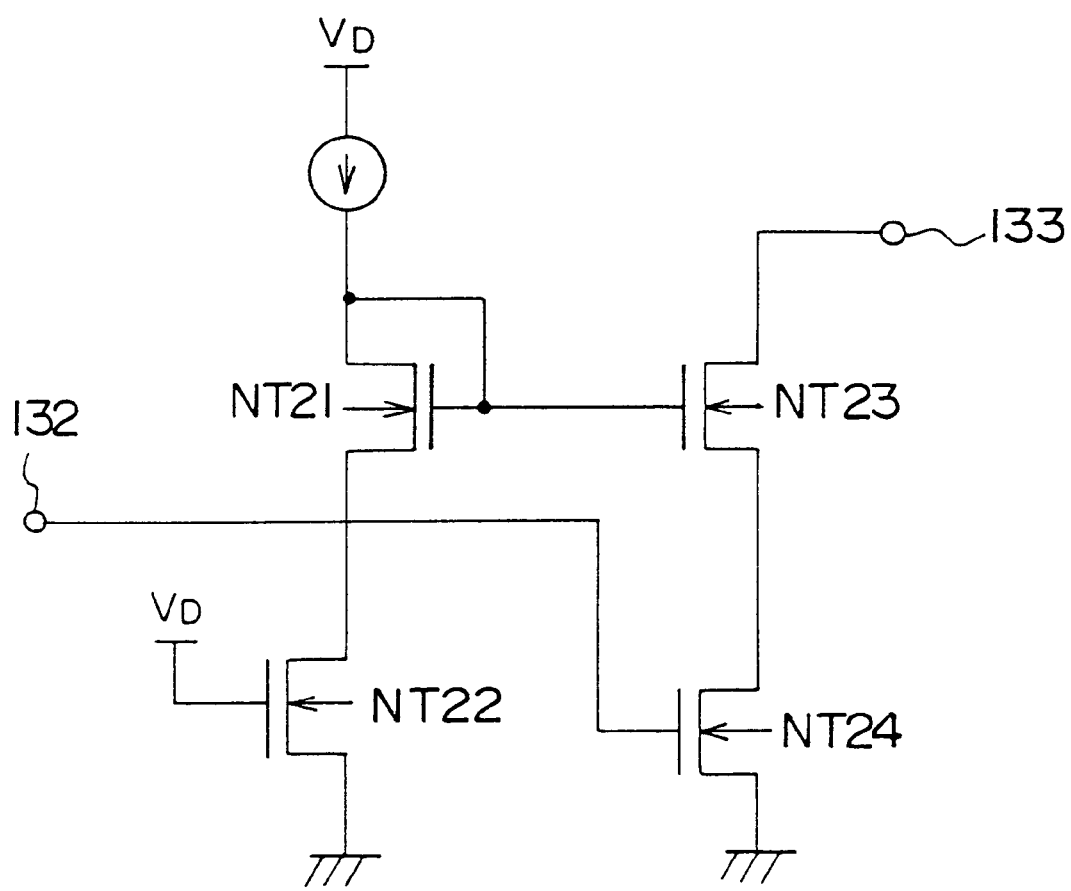
FIG. 19 is a circuit diagram of another configuration of the current switch.

FIG. 19 shows a variation of the current switch 122. Referring to FIG. 19, N-channel MOS transistors NT21 and NT23 form a current-mirror circuit. The source of the transistor NT23 is connected to the drain of an N-channel MOS transistor NT24. The gate of the transistor NT24 is supplied with a clock for switching via a terminal 132. The drain of the transistor NT23 is coupled to the capacitor C10 via a terminal 133. An N-channel MOS transistor NT22 having a drain connected to the source of the transistor NT21 is used to be balanced on the transistor NT24, and is always ON. Hence, the drain-source voltages of the transistors forming the current-mirror circuit are made substantially identical on both input and output sides thereof.

The current switches shown in FIGS. 18 and 19 may be used to form the current switches 83, 84, 87, 88, 89 and 90.

Figure 20A:
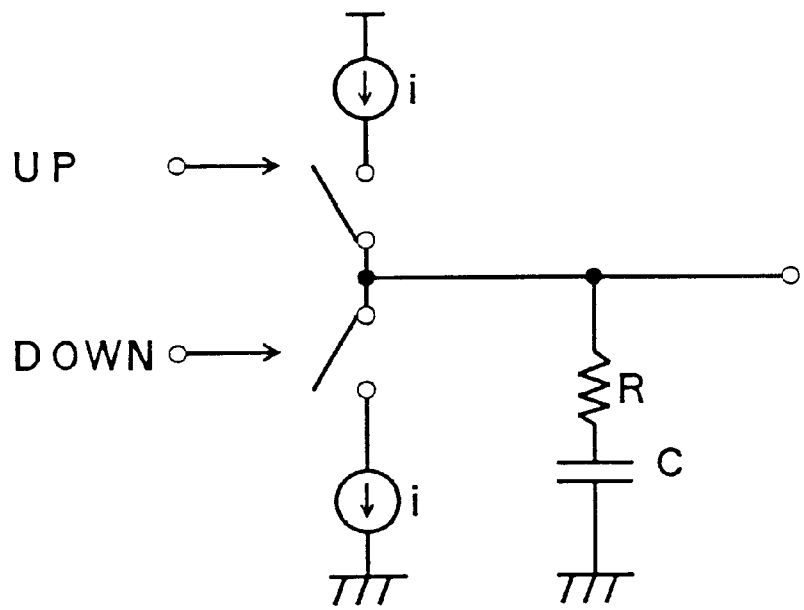
FIGS. 20A and 20B show the principle of a charge pump type low-pass filter.
Figure 20B:
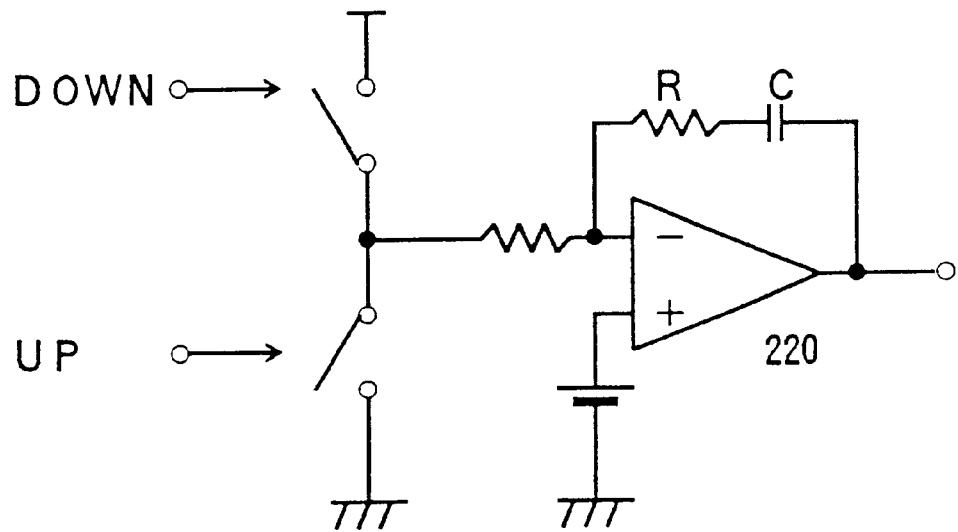

Each of the adder unit 62 and the instantaneous voltage integral unit 66 generating circuit 64 of the combining unit 60 has a charge pump type low-pass filter having the principle shown in FIG. 20A. Alternatively, it is possible to use an inverted amplifier 220 having feedback elements of the resistor R10 and the capacitor C10.

The present invention is not limited to the specifically disclosed embodiments, and variations and modifications may be made without departing from the scope of the invention.

What is claimed is:

1. A frequency comparator comprising:

a circuit comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks, wherein the circuit comprises:

a first counter which counts the first clock and outputs the first detection signal when a first count value of the first counter is equal to or greater than (n+a) where n and a are integers;

a second counter which counts the second clock and outputs the second detection signal when a second count value of the second counter is equal to or greater than (n+b) where b is an integer; and a reset unit which resets the first and second counters when the first and second count values are both equal to or greater than the n.

2. The frequency comparator as claimed in claim 1, wherein one of the first and second detection signals is output until the reset unit resets the first and second counters.

3. A frequency comparator comprising:

a circuit comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks, wherein the circuit comprises:

a first counter which counts the first clock and outputs the first detection signal when a first count value of the first counter is equal to or greater than (n+a) where n and a are integers;

a second counter which counts the second clock and outputs the second detection signal when a second count value of the second counter is equal to or greater than (n+b) where b is an integer;

a reset unit which generates a reset signal which resets the first and second counters when the first and second count values are both equal to or greater than the n;

a first hold circuit which holds the first detection signal until the first hold circuit is reset in response to the reset signal; and a second hold circuit which holds the second detection signal until the second hold circuit is reset in response to the reset signal.

4. A clock regenerating device comprising:

a frequency comparator comparing, independently of a phase relationship between first and second clocks, frequencies of the first and second clocks and outputting first and second detection signals when the first clock has frequencies higher and lower than those of the second clock, respectively, the first and second detection signals having respective pulse widths based on a difference between the frequencies of the first and second clocks;

a phase comparator generating a fine-adjustment signal based on a difference between a phase of input data and a phase of the second clock;

a combining unit generating a control signal from the first and second detection signals serving as a coarse-adjustment signal and the fine-adjustment signal; and an oscillator outputting a regenerated clock which is an oscillation output having a frequency based on the control signal and corresponds to the second clock, the combining unit combining the first and second detection signals and the fine-adjustment signal so that the following condition is satisfied:

$$(\Delta pf/\Delta ff)<(\Delta pc/\Delta fc)$$

where $\Delta pc$ and $\Delta fc$ respectively denote a phase variation and a frequency variation in the regenerated clock caused by the coarse-adjustment signal per unit time, and $\Delta pf$ and $\Delta ff$ respectively denote a phase variation and a frequency variation in the regenerated clock caused by the fine-adjustment signal per unit time.

5. The clock regenerating device as claimed in claim 4, wherein the fine-adjustment signal includes fine-adjustment up and down signals based on the phase relationship between the input data and the second clock.

6. The clock regenerating device as claimed in claim 4, wherein the coarse-adjustment signal is output during only a time based on the frequency difference between the first clock and the second clock.

7. The clock regenerating device as claimed in claim 4, wherein the coarse-adjustment signal includes a voltage or current based on the frequency difference between the first clock and the second clock.

8. A clock regenerating device comprising:

a frequency comparator comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks;

a phase comparator generating a fine-adjustment signal based on a difference between a phase of input data and a phase of the second clock;

a combining unit generating a control signal from the first and second detection signals serving as a coarse-adjustment signal and the fine-adjustment signal; and an oscillator outputting a regenerated clock which is an oscillation output having a frequency based on the control signal and corresponds to the second clock, the combining unit combining the first and second detection signals and the fine-adjustment signal so that the following condition is satisfied:

$$(\Delta pf/\Delta ff)<(\Delta pc/\Delta fc)$$

where $\Delta pc$ and $\Delta fc$ respectively denote a phase variation and a frequency variation in the regenerated clock caused by the coarse-adjustment signal per unit time, and $\Delta pf$ and $\Delta ff$ respectively denote a phase variation and a frequency variation in the regenerated clock caused by the fine-adjustment signal per unit time, wherein the frequency comparator comprises:

a first counter which counts the first clock and outputs the first detection signal when a first count value of the first counter is equal to or greater than (n+a) where n and a are integers;

a second counter which counts the second clock and outputs the second detection signal when a second count value of the second counter is equal to or greater than (n+b) where b is an integer; and a reset unit which resets the first and second counters when the first and second count values are both equal to or greater than the n.

9. A clock regenerating device comprising:

a frequency comparator comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks;

a phase comparator generating a fine-adjustment signal based on a difference between a phase of input data and a phase of the second clock;

a combining unit generating a control signal from the first and second detection signals serving as a coarse-adjustment signal and the fine-adjustment signal; and an oscillator outputting a regenerated clock which is an oscillation output having a frequency based on the control signal and corresponds to the second clock, the combining unit combining the first and second detection signals and the fine-adjustment signal so that the following condition is satisfied:

$$(\Delta pf/\Delta ff)<(\Delta pc/\Delta fc)$$

where $\Delta pc$ and $\Delta fc$ respectively denote a phase variation and a frequency variation in the regenerated clock caused by the coarse-adjustment signal per unit time, and $\Delta pf$ and $\Delta ff$ respectively denote a phase variation and a frequency variation in the regenerated clock caused by the fine-adjustment signal per unit time, wherein the combining unit comprises an adder unit which adds an integrated value of the coarse-adjustment signal, an integrated value of the fine-adjustment signal, and an instantaneous value of the fine-adjustment signal.

10. A clock regenerating device comprising:

a frequency comparator comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks;

a phase comparator generating a fine-adjustment signal based on a difference between a phase of input data and a phase of the second clock;

a combining unit generating a control signal from the first and second detection signals serving as a coarse-adjustment signal and the fine-adjustment signal; and an oscillator outputting a regenerated clock which is an oscillation output having a frequency based on the control signal and corresponds to the second clock, the combining unit combining the first and second detection signals and the fine-adjustment signal so that the following condition is satisfied:

$$(\Delta pf/\Delta ff)<(\Delta pc/\Delta fc)$$

where $\Delta pc$ and $\Delta fc$ respectively denote a phase variation and a frequency variation in the regenerated clock caused by the coarse-adjustment signal per unit time, and $\Delta pf$ and $\Delta ff$ respectively denote a phase variation and a frequency variation in the regenerated clock caused by the fine-adjustment signal per unit time, wherein the combining unit comprises an adder unit which adds the coarse-adjustment signal and the fine-adjustment signal;

an integral unit which integrates an output signal of the adder unit;

an instantaneous voltage generating unit which generates an instantaneous voltage based on the fine-adjustment signal; and a mixing unit which adds an output of the integral unit and the instantaneous voltage and thus generates the control signal.

11. The clock regenerating device as claimed in claim 10, wherein the adder unit comprises:

a first current switch which charges a first capacitor provided in the integral unit with a constant current by a supply of the first detection signal;

a second current switch which discharges the first capacitor with a constant current by a supply of the second detection signal;

a third current switch which charges the first capacitor with a constant current by a supply of the coarse-adjustment signal; and a fourth current switch which discharges the first capacitor with a constant current by a supply of the fine-adjustment signal.

12. The clock regenerating device as claimed in claim 10, wherein the adder unit comprises:

a first OR circuit which performs an OR operation on the first detection signal and the fine-adjustment signal and thus outputs a first output;

a second OR circuit which performs an OR operation on the second detection signal and the fine-adjustment signal and,thus outputs a second output;

a first switch which charges a first capacitor provided in the integral unit with a constant current by the first output; and a second switch which discharges the first capacitor with a constant current by the second output.

13. The clock regenerating device as claimed in claim 10, wherein the mixing unit comprises:

a buffer supplied with the output of the integral unit; and a first resistor supplied with an output of the buffer, the instantaneous voltage generating unit supplying a constant current to the first resistor in response to a supply of the fine-adjustment signal.

14. The clock regenerating device as claimed in claim 10, wherein the instantaneous voltage generating unit comprises:

a second resistor;

a constant-voltage source which applies a constant voltage across the second resistor; and a unit which causes a current proportional to a current flowing in the second resistor to flow in the first resistor by a supply of the fine-adjustment signal.

15. The clock regenerating device as claimed in claim 10, wherein:

the instantaneous voltage generating unit comprises an inverted amplifier having a first resistor as a feedback element; and the adder comprises another inverted amplifier having a first capacitor as a feedback element.

16. A clock regenerating device comprising:

a frequency comparator comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks;

a phase comparator generating a fine-adjustment signal based on a difference between a phase of input data and a phase of the second clock;

a combining unit generating a control signal from the first and second detection signals serving as a coarse-adjustment signal and the fine-adjustment signal; and an oscillator outputting a regenerated clock which is an oscillation output having a frequency based on the control signal and corresponds to the second clock, the combining unit combining the first and second detection signals and the fine-adjustment signal so that the following condition is satisfied:

$$(\Delta pf/\Delta ff) < (\Delta pc/\Delta fc)$$

where $\Delta pc$ and $\Delta fc$ respectively denote a phase variation and a frequency variation in the regenerated clock caused by the coarse-adjustment signal per unit time, and $\Delta pf$ and $\Delta ff$ respectively denote a phase variation and a frequency variation in the regenerated clock caused by the fine-adjustment signal per unit time, a voltage dividing circuit which includes resistors connected in series and has an end fixed to a given potential, a divided voltage being supplied to the oscillator.

17. The clock regenerating device as claimed in claim 16, further comprising a phase-locked loop which is formed on a semiconductor chip on which the clock regenerating device is formed and which includes another integral unit which outputs said given potential.

18. A clock regenerating device comprising:

a frequency comparator comparing, independently of a phase relationship between first and second clocks, frequencies of the first and second clocks and outputting first and second detection signals when the first clock has frequencies higher and lower than those of the second clock, respectively, the first and second detection signals being output for respective times based on a difference between the frequencies of the first and second clocks;

a phase comparator generating a fine-adjustment signal based on a difference between a phase of input data and a phase of the second clock;

a combining unit generating a control signal from the first and second detection signals serving as a coarse-adjustment signal and the fine-adjustment signal; and an oscillator outputting a regenerated clock which is an oscillation output having a frequency based on the control signal and corresponds to the second clock, the combining unit combining the first and second detection signals and the fine-adjustment signal so that the following condition is satisfied:

$$(\Delta pf/\Delta ff) < (\Delta pc/\Delta fc)$$

where $\Delta pc$ and $\Delta fc$ respectively denote a phase variation and a frequency variation in the regenerated clock caused by the coarse-adjustment signal per unit time, and $\Delta pf$ and $\Delta ff$ respectively denote a phase variation and a frequency variation in the regenerated clock caused by the fine-adjustment signal per unit time, wherein the oscillator comprises:

a charge current switch supplying a charging current;

a discharge current switch supplying a discharge current;

a second capacitor which is charged and discharged by the charging and discharging currents; and a circuit part which generates a switching signal for turning ON one of the charge current switch and the discharge current switch by comparing a voltage developed across the second capacitor with first and second reference voltages and generating the regenerated clock from the switching signal, the charge current switch and the discharge current switch being coupled to the second capacitor through respective current output transistors.

* * * * *